United States Patent [19]

Shin et al.

[11] Patent Number: 5,227,790
[45] Date of Patent: Jul. 13, 1993

[54] CASCADED DRIVE UNITS HAVING LOW POWER CONSUMPTION

[75] Inventors: Yasuhiro Shin; Hidetaka Kodama, both of Tokyo, Japan

[73] Assignee: Oki Electric Industry Co., Ltd., Tokyo, Japan

[21] Appl. No.: 825,384

[22] Filed: Jan. 24, 1992

[30] Foreign Application Priority Data

Jan. 31, 1991 [JP] Japan .................................. 3-010678
Jan. 31, 1991 [JP] Japan .................................. 3-010679

[51] Int. Cl.⁵ .......................................... H03M 9/00
[52] U.S. Cl. ................................. 341/100; 377/107
[58] Field of Search ............... 341/100; 340/800, 794, 340/798, 803; 350/332; 377/64, 72, 73, 54, 56, 107

[56] References Cited

U.S. PATENT DOCUMENTS

| | | |
|---|---|---|
| 4,225,847 | 9/1980 | Masuda et al. . |
| 4,393,301 | 7/1983 | Svendsen . |
| 4,500,880 | 2/1985 | Gomersall et al. . |
| 4,538,145 | 8/1985 | Mitani et al. . |
| 4,783,307 | 11/1988 | Galligan et al. ..................... 376/217 |
| 4,967,192 | 10/1990 | Hirane et al. . |
| 5,017,914 | 5/1991 | Uchida et al. . |
| 5,021,775 | 6/1991 | Babin . |
| 5,079,726 | 1/1992 | Keller ............................ 364/551.01 |

FOREIGN PATENT DOCUMENTS

| | | |
|---|---|---|
| 0244978 | 11/1987 | European Pat. Off. . |
| 0432798 | 6/1991 | European Pat. Off. . |
| 3-233492 | 10/1991 | Japan . |
| 2135099 | 8/1984 | United Kingdom . |
| 2188183 | 9/1987 | United Kingdom . |

Primary Examiner—A. D. Pellinen
Assistant Examiner—Brian K. Young
Attorney, Agent, or Firm—Spencer, Frank & Schneider

[57] ABSTRACT

A drive device with a data latch circuit which is formed of a plurality of latches, which successively latch serial drive data and output them in parallel, and a shift register having a plurality of first flip-flops which provide, responsive to clock pulses, latch signals for causing the latch to latch the serial data in succession. In one aspect of the invention, the shift register also outputs an end signal when output of the latch signals is completed, and a gate circuit which blocks input of the serial data to the data latch circuit responsive to the end signal. In another aspect of the invention, the shift register has a second flip-flop which produces an output signal after output of the latch signals to said plurality of latches is completed, and a logic gate circuit receiving a latch complete signal that is output from one of the first flip-flops upon completion of the output of the latch signals, and the output signal from the second flip-flop, and outputs a signal of the predetermined level for a predetermined period. A blocking circuit blocks the serial data or the clock pulse responsive to an end signal output from the second flip-flop.

9 Claims, 14 Drawing Sheets

CASCADED DRIVE UNITS HAVING LOW POWER CONSUMPTION

BACKGROUND OF THE INVENTION

The present invention relates to drive units, and in particular those which are formed of integrated circuits used for a liquid crystal display (LCD), being cascaded to latch a large amount of data serially sent and outputting the data in parallel, and which are featured by improved operation speed and reduced power consumption.

For drive units of which a large number of outputs is required, such as those used for driving a liquid crystal display, drive units having data latch circuits converting data serially supplied from a data generator into parallel data are used.

The drive units having data latch circuits are formed of large-sized integrated circuits having about 100 pins. With integrated circuits having 100 pins, the number of the outputs is not more than about 80. Where the number of the pins is 180 by means of TAB (tape automated bonding), the number of the outputs is not more than about 160.

To form a system handling data of a large number of bits, such as 64 bits, 4 to 8 integrated circuits, each having 80 to 160 outputs need to be cascaded.

An example of this type of circuit is proposed by the present inventor in Japanese Patent Application No. H01- 326580 and in U.S. patent application Ser. No. 07/627,408, filed Dec. 14th, 1990 now U.S. Pat. NO. 5,164,970. This will be described with reference to the drawings.

FIG. 1 is a block diagram showing a drive system comprising a plurality of drive units DC-1 to DC-N cascaded with each other. Each of the drive units DC-1 to DC-N are in the form of IC's (integrated circuits). The number N of the drive circuits could be 16, for example.

FIG. 2 is a circuit diagram showing the first prior art drive units cascaded with each other. FIG. 3 is a waveform diagram showing the operation of the various parts in FIG. 2. The following describes the first-stage drive unit DC-1 and the second-stage drive unit DC-2. But, the description of these drive units is generally applicable to any one of the drive units DC-1 and the drive unit DC-(i+1) in the next stage. The circuit of the next stage drive unit DC-2 has a configuration which is identical to the initial stage drive units DC-1, so its illustration is omitted.

In FIG. 1 and FIG. 2, data DS serially transmitted form a data generator, not shown, are applied to input terminals T1 of all the drive units DC-1 to DC-N. The clock pulses CP and latch pulses LP which are generated from the data generator are applied to the input terminals T2 and T3 of all the drive units DC-1 to DC-N. The clock pulses CP and the latch pulses LP are supplied in synchronism with the serial data DS. The latch pulses are for latching the serial data DS.

An enable signal is output from a terminal T5 of each drive unit DC-1 and is supplied to a terminal T4 of the drive unit DC-(i+1) of the next stage. In the case of the initial-stage drive unit DC-1, there is no preceding stage, and the enable input terminal T4 is grounded (connected to a logic Low level).

The serial data DS supplied to the input terminal T1 is supplied to a data latch circuit 1 via a buffer A1. The data latch circuit 1 is comprised of a plurality of flip-flops (FF's) 26 to 30 serving as latching means. For the FF's 26 to 30, data FF's or data latches are used, and serial data DS is input to the data input terminals D of the respective FF's.

The latch pulses LP applied to the input terminal T3 are supplied via buffer A3, to an operation/non-operation discrimination circuit 2, an enable latch circuit 4, a shift register or counter circuit 5, an enable signal output circuit 6, a latching driver 7 and a frequency divider circuit 8.

The shift register 5 is comprised of FF's 15 and 17 to 21, and an AND gate 16. The latch pulse LP is applied to the set input terminal S of the FF 15, and to the reset input terminals R of the FF's 17 to 21. The FF's 15 and 17 to 21 are connected so that the signal from the output terminal Q of each FF is input to the data input terminal D of the next FF. The data input terminal D of the first FF 15 is grounded (connected to the Low level).

Of the signals output from the output terminals Q of the FF's 15, 17 to 20, the Q outputs of the FF's 17 to 20 are supplied to the latch input terminals L of the FF's 27 to 30 forming the data latch circuit 1. The Q output of the FF 15 is supplied via the AND gate 16 to the latch input terminal L of the FF 26 in the data latch circuit 1.

Supplied to one input terminal of the AND gate 16 is the output of a three-input AND gate 14 forming the clock control circuit 3, and at the timing when the output of the AND gate 14 is at a logic High level, the Q output signal of the FF 15 is supplied to the latch input terminal L of the FF 26.

The clock control circuit 3 is comprised of the three-input AND gate 14 and OR gate 13, and produces operation clock signals on the basis of the clock pulses CP, the output signal of the operation/non-operation discrimination circuit 2, the output signal of the enable latch circuit 4 and the inverted Q terminal output signal of the FF 21 at the last stage in the shift register 5.

The shift clock signal output from the clock control circuit 3 is supplied not only to the AND gate 16, but also to the clock input terminals of the FF's 15 and 17 to 21.

The operation/non-operation discrimination circuit 2 makes a judgment as to whether the serial data supplied from the data generator are to be supplied to the circuit of this stage or of the next-stage. The operation/non-operation discrimination circuit 2 is comprised of three D-type FF's 9 to 11.

The frequency divider circuit 8 frequency-divides the clock pulses, the decimates the clocks for receiving the enable signal, so that the effect of the delay time of the enable signal is avoided, and is comprised of a D-type FF 75 and a two-input AND gate 76.

The enable latch circuit 4 is provided to latch, in response to the output of the frequency divider circuit 8, the enable signal supplied to the input terminal T4, and is comprised of a D-type FF 12.

The output signal from the Q output terminal of the FF 19 at the third last stage is supplied to one input terminal of a NOR gate 23 forming the enable signal output circuit 6. The enable signal output circuit 6 is comprised of the NOR gate 23, a NOR gate 22 and an inverter 24. The NOR gates 23 and 22 form an R-S FF 61. The output of the inverter 24 is output of the terminal T5, and is supplied as the enable signal to the input terminal T4 of the succeeding stage.

The operation of the drive unit DC-1 will now be described.

The serial data DS, the clock pulse signal CP, and the latch pulse signal LP sent from the data generator are of the waveforms as shown in FIG. 3, the waveforms being continuous.

When the latch pulse LP is input, the FF's 10, 75, 12, and 17 to 21 are reset during the High level part of the latch pulse, so the Q output terminals of these FF's go Low.

In the case of the FF 21, the inverted Q output goes High, and this signal is sent to the first input terminal of the AND gate 14. The R-S FF 61 is also reset and its Q output goes Low, and is output via the inverter 24, so that a High signal is output at the terminal T5.

The FF 15 is set by the High level of the latch pulse and the Q output terminal goes High.

When the latch pulse LP later goes Low, the Q output of the FF 9 goes High, and is sent to the D input terminal of the FF 10. At the same time, the serial data DS having been latched at the latch circuits 26 to 30 are then latched by the latching LCD driver 7, and signals of the LCD drive levels are output from the output terminals 32 to 36.

At the rising edges of the clock pulses CP sent from the data generator, the serial data DS sent from the data generator are input to the D input terminals of the respective FF's of the data latch circuit 1.

The enable input terminal T4 of the initial-stage drive unit DC-1 is set at the Low level, and this Low level is inverted at the inverter A4 to become a High level, which is sent to the D input terminal of the FF's 11 and 12. Once the Q output terminal of the FF 10 goes Low, the Q output of the FF 11 goes High and remains High. The High level output is sent to the first input terminal of the two-input OR gate 13 whose output is connected to the second input terminal of the three-input AND gate 14.

The first input terminal of the three-input AND gate 14 is High, so the clock pulses CP applied to the third input terminal of the AND gate 14 is gated through without change.

Applied to the input terminal T4 of the next-stage drive unit DC-2 is a High enable signal from the output terminal T5 of the initial-stage LCD drive unit DC-1. The High signal is inverted at the inverter A4 into a Low signal, which is then applied to the D input terminals of the FF's 11 and 12. Once the Q output of the FF 10, which is applied to the clock input terminal of the FF 11, falls from High to Low, the Q output of the FF 11 goes Low and remains at the Low level, as mentioned above, and is supplied to the first input terminal of the two-input OR gate 13.

The Q output of the FF 12 applied to the second input terminal of the OR gate 13 is Low, so the output of the two-input OR gate 13 is Low.

At the three-input AND gate 14 to which the output of the two-input OR gate 13 is supplied, the AND condition is not satisfied, so the clock pulses CP being applied to the third input terminal of the AND gate 14 are not gated through.

If a clock pulse CP is input to the initial-stage drive unit DC-1, it is sent via the AND gate 14 to the second input terminal of the two-input AND gate 16. Since the first input terminal of the two-input AND gate 16 is receiving a High signal, the output of the two-input AND gate 16 will be High. When the clock pulse falls from High to Low, as shown in FIG. 3, the Q output of the FF 15 goes Low. The output of the two-input AND gate 16 will then be Low, and is sent to the latch input terminal L of the FF 26, so the first bit of serial data DS is latched. At the same time the Q output of the FF 17 goes High. Concurrently therewith, the Q output of the FF 10 goes High to reset the FF 9. Similarly, the FF 75 increments its count by one, and its Q output goes High.

The FF's 9, 10 and 75 in the other drive units DC-2 to DC-N function in the same manner.

When the second bit of the serial data DS and clock pulse CP are sent, the Q output of the FF 17 goes Low and the Q output of the FF 18 goes High. The Q output of the FF 17 is applied to the latch input terminal of the FF 27, so the second bit of the serial data DS is latched by the FF 27. In put then to the first input terminal of the two-input AND gate 76 to which the Q output of the FF 75 is input is a High signal, so the clock pulse to the second input terminal is passed through the AND gate 76 and input to the clock input terminal of the FF 12. The FF 12 reads the High level (inverted T4 signal) at th data input terminal and outputs it via its Q output. Subsequently, at every even clock pulse, the signal at the T4 terminal is read, by means of the FF's 75 and 12 and the AND gate 76, and a High signal is output to the second input terminal of the OR gate 13.

Concurrently therewith, the FF 10 reads the Low signals at the Q output of the FF 9, and outputs it via its Q output. At the falling edge thereof, the FF 11 reads the inverted logic level (High level in this case) of the signal input to the T4 terminal and supplies it to the first input terminal of the OR gate 13.

In the next-stage drive unit DC-2, similar functions are performed by means of the FF's 9, 10, 11, 75 and 12 and the AND gate 76, and the Low signal is latched by the FF's 11 and 12, and output to the OR gate 13.

The input signals to the OR gate 13 are both Low, so the second input terminal of the three-input AND gate is Low, prohibiting passage of (i.e., blocking) the clock pulse CP signal at the third input terminal.

When the third bit of the serial data DS and clock pulse CP are sent to the initial-stage drive units DC-1, the Q output of the FF 18 goes Low and the Q output of the FF 18 is supplied to the latch input terminal of the FF 28, so the third bit of the serial data is latched by the FF 28. In this way, the serial data DS sent from the data generator are successively latched by the respective FF's 26 to 30 in the data latch circuit 1 in synchronism with the clock pulses CP. When the last-but-one bit of the serial data is input the initial-stage drive unit DC-1 (when the laser-but-two clock is input) the Q output of the FF 19 goes High and is transmitted to the two-input NOR gate 23 of the R-S FF 61, which is thereby set, and a Low signal having been obtained by inversion at the inverter 24 is output via the terminal T5, and is transferred to the terminal T4 of the next stage. This signal is the enable signal for the next stage, and is passed via the input terminal T4 of the next-stage drive unit DC-2, and, in the same way as the initial-stage drive unit DC-1, is applied via the inverter A4 to the respective D input terminals of the FF's 11 and 12.

When a clock pulse CP is further input, the Q output of the FF 19 goes Low and is applied to the latch input terminal of the FF 29, so the last-but-one bit is latched by the FF 29. Concurrently therewith, the Q output of the FF 20 goes High. The Q output of the FF 75 in the next stage then goes High, but the AND gate 76 does not output a pulse.

When the clock pulse CP is input, the Q output of the FF 20 goes Low, and this Q output of the FF 20 is applied to the latch input terminal of the FF 30, so the last bit DS for the initial stage is latched in the FF 30. The Q output of the FF 21 goes High and the inverted Q output of the FF 21 goes Low. The inverted Q output signal of LOW level is applied to the first input of the three-input AND gate 14 as an end signal. As a result, the clock pulse CP sent from the data generator is blocked at the three-input AND gate 14.

Concurrently, since the Q output of the FF 75 of the next-stage drive unit DC-2 is High, the clock pulse CP is transmitted via the AND gate 76 to the clock input terminal of the FF 12, so at the falling edge of the clock pulse CP, the FF 12 latches the High signal obtained by inverting the enable signal, and transmits it via its Q output, and via the second input terminal of the two-input OR gate 13 to the second input terminal of the three-input AND gate 14. Since the first input terminal of the AND gate 14 is also High, the clock pulse sent from the data generator is passed through the thee-input AND gate 14, and is sent to the clock input terminals of the FF's 15, and 17 to 21 and the second input terminal of the two-input AND gate 16.

The clock pulse next sent from the data generator is the pulse on which the next stage begins to operate. At the falling edge of this clock pulse, the Q output of the FF 15 falls, and the Q output of the FF 17 goes High. A High signal has been applied to the first input of the two-input AND gate 16, up to the falling edge of the clock pulse, so the clock pulse is passed, only once, through the AND gate 16 and input to the latch input terminal of the FF 26. Input to the D input terminals of the FF's 26 to 30 are serial data DS from the data generator, so in the next-stage drive unit DC-2, the FF 26 latches the data DS at the falling edge of the clock pulse CP, and sends it via its Q output to the driver 7.

When the clock pulse CP is next sent from the data generator, the Q output of the FF 17 goes Low, the Q output of the FF 18 goes High, and a serial data DS corresponding to the clock pulse CP is latched by the FF 27. Subsequently, the serial data DS are successively latched at the clock pulses CP in a similar manner.

When the last-but-two clock pulse CP that is input to the second-stage drive unit DC-2 is input, the Q output of the FF 19 at the last-but-two stage in the shift register 5 goes High. From this High signal, the R-S FF 61 is set, and this High signal is passed through the inverter 24 to become a Low signal, which is sent via the output terminal T5 to the enable input terminal T4 of the third-stage drive unit DC-3 (not illustrated as such).

When the clock pulse CP is next sent from the data generator, the Q output of the FF 19 of the second-stage drive unit DC-2 goes Low and the Q output of the FF 20 goes High. Then, the Q output of the FF 19 is sent to the latch terminal L of the FF 29, and the serial data corresponding thereto is latched by the FF 29.

When the clock pulse CP is next sent from the data generator, the Q output of the FF 20 goes Low and the Q output of the FF 21 goes High, and its inverted Q output goes Low. Then, the Q output of the FF 20 is sent to the latch terminal L of the FF 30, and the serial data corresponding thereto is latched by the FF 30.

The inverted Q output (Low) of the FF 21 is applied to the first input terminal of the three-input AND gate 14, so the output of the three-input AND gate 14 is fixed at the Low level. As a result, the clock pulse CP sent from the data generator is blocked at the three-input AND gate 14.

The Q outputs of the FF's 26 to 30 are sent to the latching driver 7.

Subsequently, when the latch pulse LP is sent from the data generator after the data is sent to the drive units in the third and subsequent stages, the drive unit circuit 7 latches the data being input from the data latch circuit 1 and outputs them in parallel via the output terminals 32 to 36.

As has been described, in the prior art drive unit, for the purpose of reducing power consumption, enable signals are used to permit input of the clock only to the drive unit to latch the data sent from the data generator and output the data, and to prohibit the clock from being input to other drive units.

Accordingly, when the power supply for the logic circuit is 5 V, the power supply of the drive unit is 40 V, the LCD is not connected, and the clock pulse frequency is 3 MHz, the consumption current at the time of operation is about 5 mA, and is about 2 mA in the state in which the clocks are not accepted.

In the prior art example, one bit of serial data is transferred. But with the increase in size of the LCD screen, increases to four bits of serial data, eight bits of serial data, and so on is possible, and the frequency of the clock pulse CP of 3 MHz may be increased to 6 MHz, 8 MHz, and so on.

With an increase in the clock pulse CP frequency, the consumption current is increased from 5 mA (3 MHz), to 10 mA (6 MHz), and to 13 mA (8 MHz). Similarly, in the state in which the clocks are not accepted, it is increased from 2 mA (3 MHz) to 4 mA (6 MHz) and to 5 mA (8 MHz). With an increase in the number of bits, the consumption current is increased from 13 mA (1 bit) to 19 mA (4 bits), to 27 mA (8 bits) and to 35 mA (12 bits). In the state in which the clocks are not accepted, it is increased from 5 mA (1 bit) to 11 mA (4 bits), to 19 mA (8 bits), and to 27 mA (12 bits).

This is a problem yet to be solved for the reduction of the power consumption in the drive unit for a large-screen LCD display.

Another problem associated with the prior-art circuit is encountered when it is implemented on an integrated circuit using a 4 μm MOS process.

When the frequency of the clock pulses CP is high, e.g., 6 MHz, the clock pulses CP input to the third input terminal of the AND gate 14 in the clock control circuit 3 are passed through the AND gate 14 and transmitted as shift clock pulses to the clock input terminals of the FF's 15 and 7 to 21. Assume that the last bit of shift data DS is to be read into the latch 30. The last pulse CP for this drive unit turns the Q output of the FF 20 from High to Low, while the FF 21 latches the Q output of the FF 20 and outputs, via its inverted Q output, a Low signal. This Low signal is transmitted to the first input terminal of the AND gate 14, and when the clock pulse next rises High, the output of the AND gate 14 remains at the Low level. However, in the 4 μm C-MOS process, the sum of the delay from the third input terminal of the AND gate 14 to the output terminal, the delay of the shift clock pulse over the wiring conductor (the signal delay due to the load capacitance of the FF's 15 and 17 to 21, and the wiring conductors), the delay of the inverter Q output with respect to the clock input terminal of the FF 21, and the signal propagation delay time over the wiring conductors from the inverted Q output of the FF 21 to the first input terminal of the AND gate 14 is about 88 ns, so the third input terminal of the AND gate 14 goes High about 5 ns before the first input terminal of the AND gate 14 falls. The period of 6 MHz is 166 ns, but with the duty ratio of 50% the period of the Low level the clock pulse is only 83 ns, so the High level of the clock pulse CP is passed through the AND gate 14 to the clock input terminals of the FF's 15, 17 to 21. After 5 ns, the Low signal is input to the first input terminal of the AND gate 14, whereupon the output of the AND gate 14 goes Low. Because of these timing problems, the output of the AND gate 14 contains a spike-like pulse of a short period. The spike-like pulse is transmitted to the clock input terminals of the FF's 15 and 17 to 21, but as the data input terminals of the FF's 15 and 17 to 21 are all Low, the Q outputs of the FF's 15 and 17 to 21 are all Low and the inverted Q output of the FF 21 is High. As a result, the inverted Q output of the FF 21 is again transmitted to the first input terminal of the AND gate 14, so the prohibition of the input of the clock uplse CP to the third input terminal of the AND gate 14 is nullified, and the clock pulses are thereafter continuously passed through the AND gate 14 and transmitted as shift clocks to the clock input terminals of the FF's 15 and 17 to 21. The Q outputs of the FF's 15 and 17 to 21 are Low, so the data latches 26 to 30 of the data latch circuit 1 do not read the shift data DS. When the latch pulse LP is input, the outputs of the data latch circuit 1 are passed through the drive 7, and output via the output terminals 32 to 36. These outputs are not associated with abnormality, and no erroneous results are output to the outside, but internally the prohibition of the input to the clock pulses is failing and the power consumption savings are not achieved.

With such failure of power consumption saving, when the power supply for the logic circuit is 5 V, the power supply for the drive unit is 40 V, the LCD is not connected, and the clock pulse frequency is 3 MHz, the consumption current at the time of operation is about 5 mA, and is about 2 mA in the state in which the clocks are not accepted. It is expected that the consumption current is about 4 mA when the clock pulses are not accepted, if the clock pulse frequency is 6 MHz and the consumption current is about 10 mA when the clock pulses are gated through. But in fact, the consumption current int he state in which the clock pulses are not accepted is about 10 mA. This has been an obstacle to reduction in power consumption in a large-sized LCD display using about 16 drive units (IC's).

SUMMARY OF THE INVENTION

In order to solve the above problems, a data drive device according to the invention comprises:
- a data input terminal (T1) at which drive data (DS) is serially input;
- a data latch circuit (1) which is formed of a plurality of latch means (26 to 30), which successively latch the drive data and output them in parallel;
- a shift register or counter circuit (5) which provides, responsive to clock pulses (CP), latch signals (Q outputs of FF's 15 and 17 to 20) for bringing the latch means into a state in which they are capable of latching in succession, and outputs an end signal (inverted Q output of FF 21) when the output of the latch signals is completed; and
- a gate circuit (A40) which is inserted between the data input terminal (T1) and the data latch circuit (1) and which is responsive to the end signal to prohibit input of the drive data to the data latch circuit (1).

With the above configuration, in each of the cascaded drive units, in the state in which the clock pulses CP are accepted, the data input is also accepted, and in the state in which the clock pulses CP are not accepted, the data input is also not accepted, so the operation is achieved properly, and in the non-operative state, the data latch circuit and the shift register are in non-operative state, so the consumption current can be substantially reduced.

According to another aspect of the invention, the drive circuit comprises:
- a data input terminal (T1) at which drive data (DS) is serially input;
- a data latch circuit (1) which is formed of a plurality of latch means (26 to 30), which successively latch the drive data (DS) and output them in parallel;
- a shift register or counter circuit (5) having
  - a plurality of first flip-flops (15 and 17 to 20) which provide, responsive to clock pulses (CP), latch signals for brining the latch means (26 to 30) into a state in which they are capable of latching in succession;
  - a second flip-flop (21) which produces an output signal (Q output of FF 21) after the output of the latch signals to said plurality of latch means is completed; and
  - a gate circuit (B50) receiving a latch complete signal of a predetermined level that is output from a predetermined one of the first flip-flops (FF 20) at the time of the completion of the output of the latch signals to said plurality of latch means, and the output signal from said second flip-flop and performing a logical operation on them, and supplying a signal of said predetermined level for a predetermined period based on the latch complete signal and the output signal of said second flip-flop (21); and
- a prohibiting circuit (14) responsive to an end signal output from said second flip-flop to prohibit input of a predetermined input signal from outside.

With the above configuration, an input to a second FF which outputs an end signal when the output of the latch signal to the plurality of latch means is completed is generated by a gate circuit which receives a latch complete signal of a predetermined level output from a predetermined one of the first FF's upon the completion of the output of the latch signal to the plurality of latch means and an output signal from the second FF, and performing a logical operation on them to produce a signal of a predetermined level for a period on the basis oft he latch complete signal and the output signal. Accordingly, even if the clock pulse input of which is to be prohibited is erroneously input as a shift clock pulse to the second FF because of a delay, the data input to the second FF is held at said predetermined level for the period based on the latch complete signal and the output signal, so that regardless of the input of the clock pulse, the second FF can output the end signal for the period in which the predetermined level is held at the predetermined level, and the input of the input signals such as the clock pulse and the drive data to the shift register and the data latch circuit can be prohibited without fail.

BRIEF DESCRIPTION OF THE DRAWINGS

FIG. 10A and FIG. 10B are waveform diagrams showing the operation, with the effects of the propagation delays being taken account of.

DETAILED DESCRIPTION OF THE PREFERRED EMBODIMENTS

Figure 1:
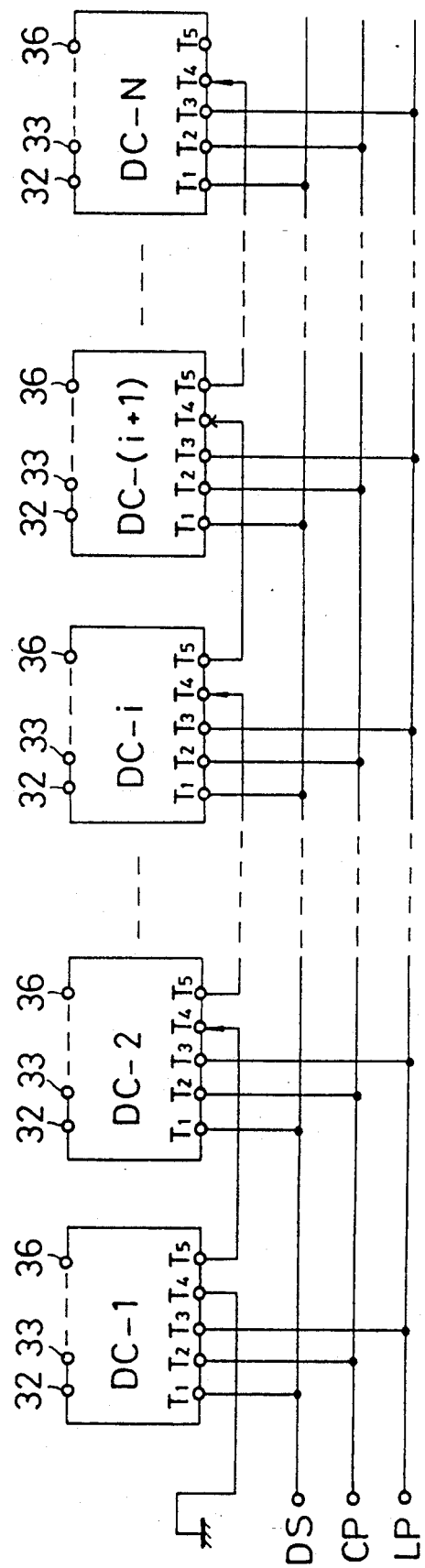
FIG. 1 is a block diagram showing a prior-art drive system comprising cascaded drive units.

An embodiment of the invention will now be described with reference to FIG. 4 and FIG. 5. The configuration of the overall drive system of this embodiment is as shown in FIG. 1, and this embodiment differs from the prior-art system in the configuration of part of the circuits within each of the drive units DC-1 to DC-N.

Figure 2:
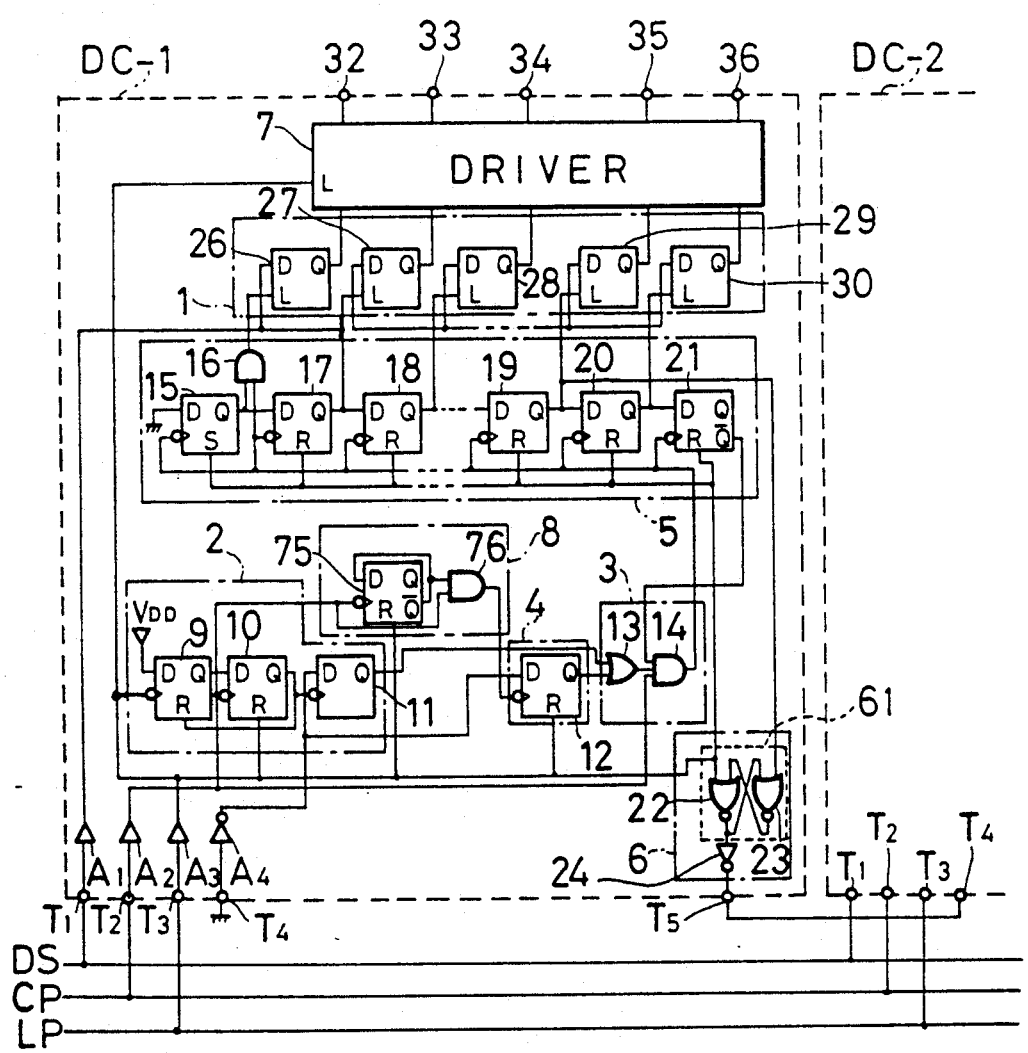
FIG. 2 is a circuit diagram showing a prior-art first stage drive unit.
Figure 3:
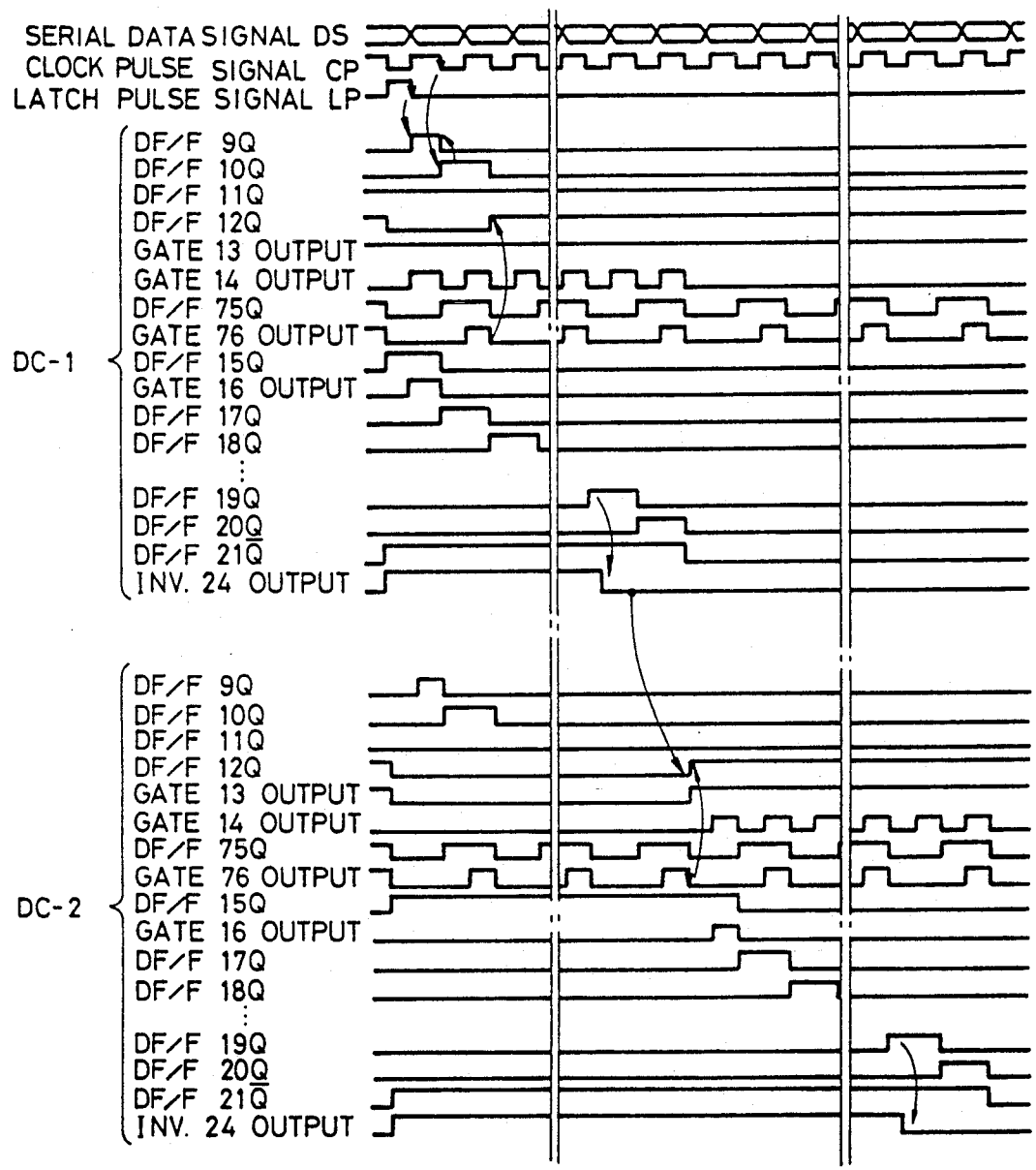
FIG. 3 is a waveform diagram showing the operation of the prior art drive unit of FIG. 2.
Figure 4:
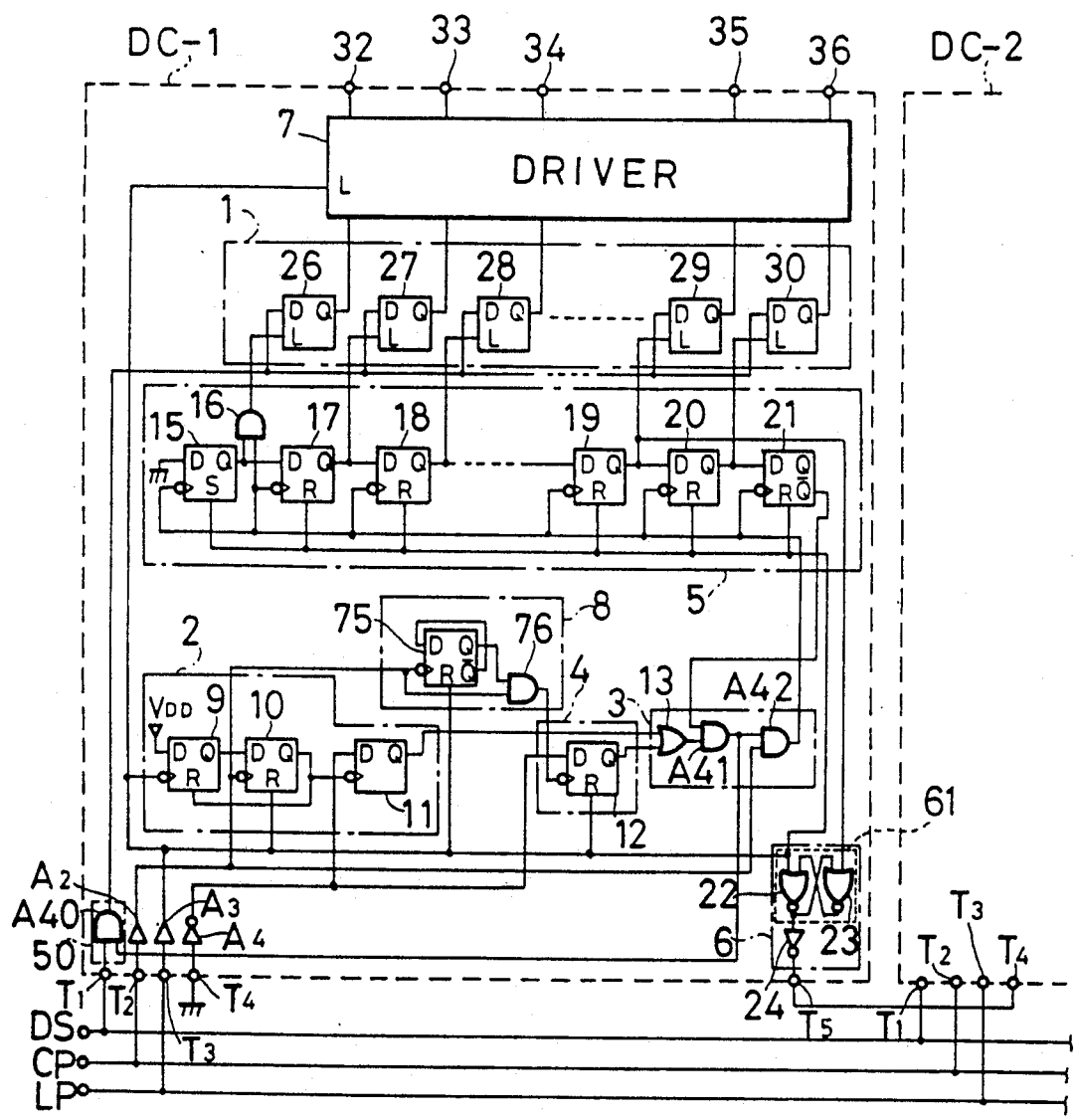
FIG. 4 is a circuit diagram showing a drive unit of an embodiment of the invention.

FIG. 4 shows the circuit configuration of the drive unit DC-1. Other drive units DC-2 to DC-N have identical configuration, so their illustration is omitted. In the circuit of FIG. 4, the parts identical to those in FIG. 2 are given identical reference numerals and their description is omitted.

In the following description, the second stage in the cascade connection is called a next stage, and also represents the third and subsequent stages, and the description of the second stage is generally applicable to the third and subsequent stages.

In FIG. 4, serial data DS serially sent from a data generator, not shown, are respectively applied to the input terminals T1 of the initial-stage drive unit DC-1 and the next-stage drive unit DC-2. The clock pulses CP input in synchronism with the serial data DS are applied to the input terminals T2 of the respective stages, and the latch pulses LP for latching the serial data DS are applied to the input terminals T3 of the respective stages. The enable signal is output from the driver terminal T5 of each stage, and applied to the terminal T4 of the next stage. In the case of the initial-stage drive unit DC-1, there is no preceding stage, and the enable input terminal T4 is grounded (connected to the Low level). The serial data DS applied to the input terminal T1 is input to the first input terminal of the two-input AND gate A40 in the data input control circuit 50. The output of the AND gate A40 is connected to the data input terminals of a plurality of FF's 26 to 30 in the data latch circuit 1. The FF's 26 to 30 may be formed of data flip-flops (D-FF) or data latches (D-latches). The latch pulse LP applied to the input terminal T3 is supplied via the buffer A3 to the operation/non-operation discrimination circuit 2, the frequency divider circuit 8, the enable latch or judgment circuit 4, the enable signal output circuit 6, the shift register or counter circuit 5, and the latching driver 7.

The shift register or counter circuit 5 is comprised of FF's 15 and 17 to 21, and the latch pulse LP is applied to the set input terminal S of the FF 15 and the reset input terminals R of the FF's 17 to 21. These FF's 15 and 17 to 21 are so connected that the signals output from the output terminals Q of the respective FF's are connected to the data input terminals of the next FF's. The data terminal D of the initial FF 15 is grounded (connected to the Low level). Among the signals output from the output terminals Q of the FF's 15 and 17 to 20, the Q outputs of the FF's 17 to 20 are applied to the latch input terminals L of the FF's 27 to 30 forming the data latch circuit 1.

The Q output of the FF 15 in the shift register is connected to the first input terminal of the AND gate 16, and its output is input to the latch terminal L of the FF 26 in the data latch circuit 1.

The clock pulse CP applied to the input terminal T2 is supplied via the buffer A2 to the operation/non-operation discrimination circuit 2, the frequency divider circuit 8 and the clock control circuit 3. The operation/non-operation discrimination circuit 2 is comprised of FF's 9, 10 and 11. The data input terminal of the FF 9 is connected to $V_{DD}$ (High level) and the input to its clock input terminal is a latch pulse LP. The Q output of the FF 9 is connected to the data input of the FF 10, and the input to the clock input terminal of the FF 10 is a clock pulse CP. Input to the reset terminal R of the FF 10 is a latch pulse LP, and the Q output of the FF 10 is connected to the reset input terminal R of the FF 9 and the clock input terminal of the FF 11. Input to the data input terminal of the FF 11 is an enable signal, which is obtained by inverting at the inverter A4, the Low signal at the T4 input terminal into a High signal (in the case of the initial stage), or the High signal at the T4 input terminal is inverted by the inverter A4 into a Low level signal (in the case of the next stage). The Q output of the FF 11 is a clock control signal which is High for the initial stage and Low for the next stage. When there is an extra IC pin, the operation/non-operation discrimination circuit may be omitted and an input signal of a High level of a Low level may be input from the outside of the IC to indicate operation or non-operation for each stage.

The frequency divider circuit 8 is comprised of an FF 75 and an AND gate 76. The inverted Q output terminal of the FF 75 is connected to the D (data) input terminal of the FF 75, so it operates as a T-type flip-flop (T-FF). Input to the clock input terminal of the FF 75 is a clock pulse CP and the FF 75 operates at the falling edge (hereinafter referred to as a trailing edge) of the clock pulse. The Q output terminal of the FF 75 is connected to the first input terminal of the AND gate 76, and the clock pulse CP is connected to the second input terminal of the AND gate 76. The output terminal of the AND gate 76 is connected to the clock input terminal of the FF 12 in the enable latch circuit 4. Input to the data input terminal of the FF 12 is the enable signal. The FF 75 and the AND gate 76 may be omitted by connecting the clock pulse CP with the clock input terminal of the FF 12. The Q output of the FF 11 is connected to the first input terminal of the OR gate 13 in the clock control circuit 3, the Q output of the FF 12 is connected to the second input terminal of the OR gate 13, and the output of the OR gate 13 is connected to the second input terminal of the AND gate A41. Connected to the first input terminal of the AND gate A41 is the inverted Q output of the FF 21. The output of the AND gate A41 is connected to the first input terminal of the AND gate A42 and the second input terminal of the AND gate A40 of the input data control circuit 50. Input to the second input terminal of the AND gate A42 is the clock pulse CP, and the output terminal of the AND gate A42 is connected to the clock input terminals of the FF's 15 and 17 to 21 and the second input terminal of the AND gate 16. The enable output circuit 6 is comprised of two-input NOR gates 22 and 23 and an inverter 24. Input to the first input terminal of the NOR gate 22 is a latch pulse LP, and connected to the second input terminal is the output of the NOR gate 23. The output terminal of the NOR gate 22 is connected to the first input terminal of the NOR gate 23 and connected via the inverter 24 to the enable output terminal T5. Connected to the second input terminal of the NOR gate 23 is the Q output terminal of the FF 19. (When the flip-flop 75 and the AND gate 76 are omitted, as described above, it is necessary for the Q output terminal of the FF 20 to be connected to the second input terminal of the NOR data 23.) Connected to the L input terminal of the drive unit (latching drive unit) 7 is the latch pulse LP, and the input from the Q outputs of the FF's 26 to 30 of the data latch circuit 1 are connected via the driver 7 to the output terminals 32 to 36.

The operation of the above drive circuit will now be described with reference to FIG. 5. The description is made on the drive circuits in the first and second stages, but the description is mostly applicable to the drive circuit of any sage (i-th stage) and the succeeding stage ((i+1)-th stage). The description on the the stage next to the initial stage should be construed to any of the succeeding stages.

Figure 5:
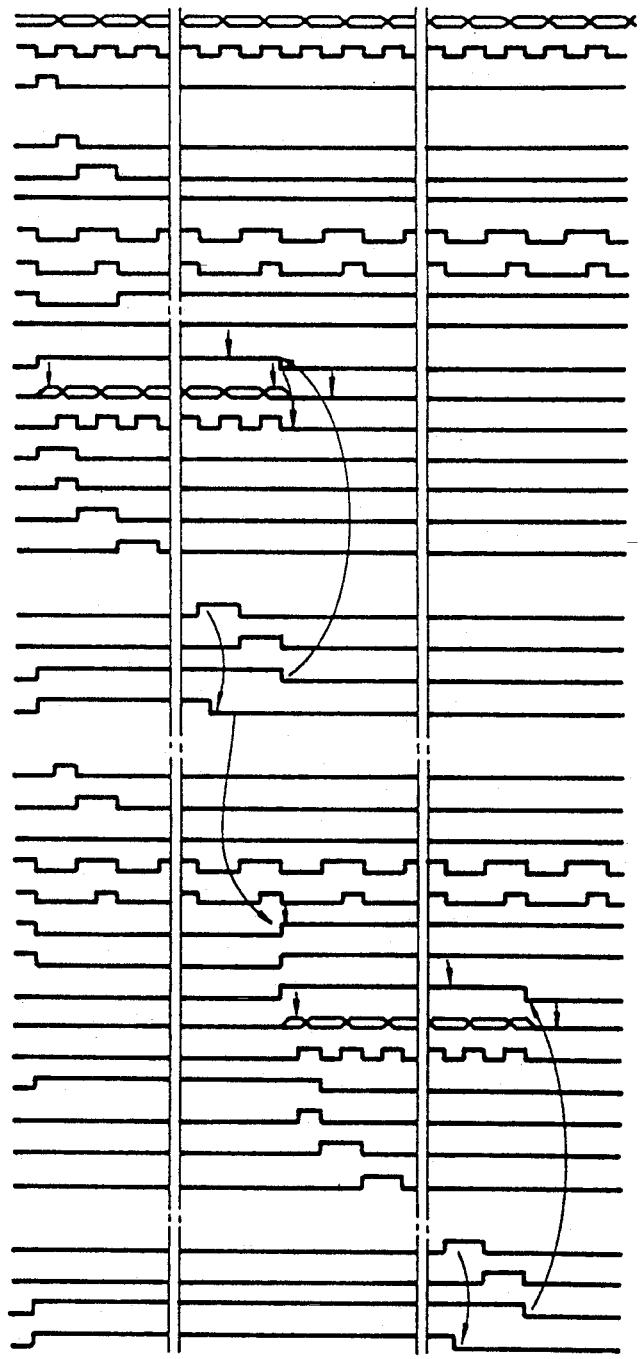
FIG. 5 is a waveform diagram showing the operation of the embodiment of FIG. 4.

The serial data signals DS, the clock pulses CP and the latch pulse signal LP are of the waveforms as shown in FIG. 5, with the waveforms being continuous.

The operation/non-operation discrimination circuit 2 performs its operation by having the FF 11 read and output, via its Q output terminal, the signal obtained by inverting the signal at the enable input terminal T4 at the falling edge of the second clock after the latch uplse LP is input, in the same way as in the prior art. In the initial stage, the High level is read and output via the Q output of the FF 11. The R-S FF 61 is reset by the latch pulse LP. The output of the R-S FF 61 is inverted by the inverter 24 to become a High signal, which serves as an enable signal input for the next stage. The FF 11 in the next drive unit reads the Low level signal obtained by inversion at the inverted A4. The Low level signal is then output via the Q output of the FF 11. Thus, "High" is found in the initial drive unit stage and "Low" is found in the next drive unit stage.

In the initial stage DC-1, the Q output of the FF 11 is High, so the output of the OR gate 13 is fixed at the High level. In the next stage DC-2, the Q output of the FF 11 is Low to the output of the OR gate 13 is determined by the Q output of the FF 12. The frequency divider circuit 8 is initially reset by the latch pulse LP, and operates to permit passage of the even clock pulses CP which are thereafter input. At the railing edge of the clock, the FF 12 of the enable latch circuit 4 in the initial stage reads a High signal. In the next stage, the FF 12 reads a Low signal. The read signal is input to the second input of the OR gate 13. In the initial stage, the enable input terminal T4 is fixed at the Low level, so the subsequent operation is identical, and its description is therefore omitted. Accordingly, in the other stage, the inputs of the OR gate 13 are both Low, its output is therefore Low, the output of the AND gate A41 is therefore Low, the output of the AND gate A42 is therefore Low, the output of the AND gate A40 is fixed at the Low level. In other words, the input of the clock pulse CP and the data input signal DS is blocked, and the outputs of the AND gates A40 and A42 are fixed at the Low level, and the circuit is held in the static state, so the consumption current does not flow at all through the shift register 5, the data latch circuit 1, the data input controller 50 and the clock control circuit 3.

In the initial stage DC-1, the second input terminal of the AND gate A41 is High, and the inverted Q of the FF 21 connected to the first input terminal is High because of the initial reset by means of the latch pulse LP, and the output of the AND gate A41 is also High. The High signal from the AND gate A41 is transmitted to the second input terminals of the AND gates A40 and A42 to gate the signals through, and the AND gate A40 permits passage of the serial data signal input from the first input terminal T1, and the AND gate A42 permits passage of the clock pulse signal input from the second input terminal T2.

The FF 15 is set by the latch pulse LP, so its Q output is High, while other FF's 17 to 21 are reset by the latch pulse LP and their Q outputs are Low. Accordingly, the first input terminal of the AND gate 16 in the initial stage is made High to passage of the output pulse (shift clock) of the AND gate A42 to the latch input terminal L of the FF 26 as a latch signal. (Where the FF's 26 to 30 are formed of data latches, the AND gate 16 is necessary to prevent the latch input signal of the FF 26 from being High, as described above. Where the FF's 26 to 30 are formed of data flip-flops the data are read at the edges of the clocks and the AND gate 16 is unnecessary.) In the next drive unit stage, the output of the AND gate 42 is fixed at the Low level, so the latch signal to the data latch circuit 1 is blocked.

In the initial driven unit state, the AND gates A40 and A42 gate signals through, so the clock pulse CP is passed through the AND gates A42 and 16, and transmitted to the latch input terminal of the FF 26. The serial data DS input in synchronism with the clock pulse CP is passed through the AND gate A40, and input to the data input of the FF's 26 to 30, so responsive to the clock pulse CP the first input after the input of the latch pulse LP, the FF 26 in the initial stage DC-1 reads the serial data DS and transfers it to the driver 7. At the trailing edge of the clock pulse, the FF 15 reads the Low signal, and outputs it via its Q output, so the AND gate 16 is blocked, and the shift pulses (shift clock pulses CP) which are thereafter output from the AND gate A432 are not transmitted to the FF 26. At the trailing edge of the shift clock pulse, the FF 17 reads the High signal at its D terminal and outputs it via its Q output. Next, the second clock pulse CP input after the latch pulse LP is input is transmitted via the AND gate A42 to the shaft register 5. At the trailing edge of the uplse, the FF 17 reads the Low signal, and makes its Q output Low and the FF 18 reads a High signal, making its Q output High. The FF 27 to which the High Q output of the FF 17 has been transmitted reads the serial data DS being input and transmits it via its Q output of the driver 7.

Subsequently, responsive to the third clock pulse CP after the latch pulse is input, the FF 28 reads the serial data responsive to the Q output signal of the FF 18 and outputs it to the driver 7. As the above operation is continued and when the third bit of serial data is counted from the end of the serial data for the initial stage DC-1 is transmitted to the driver 7, the Q output of the FF 19 goes High and, responsive to this signal, the R-S FF 61 is set, and produces a High signal, which is inverted by the inverter 24 to become a Low signal, which is output via the terminal T5.

The enable signal (Low level) output via the terminal T5 is input to the enable signal input terminal T4 of the next stage DC-2, and passed via the inverter A4 to the data (D) input terminals of the FF's 11 and 12. A pulse is input to the clock input terminal of the FF 12, but the enable signal is associated with the delay through the AND gate A42, the FF 19, the NOR gates 22 and 23, and the inverter 24 in the initial stage, so that the transition at this instance cannot be read.

When the second clock pulse as counted from the end of the data for the initial stage DC-1 is input, the Q output terminal of the FF 19 goes Low and the Q output terminal of the FF 20 goes High. The second bit as counted from the end of the serial data DS for the initial stage DC-1 is latched by the FF 29 and is transmitted to the driver 7. In the next stage, no pulse is then output from the AND gate 76, so the FF 12 does not read the High signal on its data input terminal, and the second input terminal of the AND gate A41 is held Low and input of the serial data DS and the clock pulse CP is blocked. When the last clock pulse of the data for the initial stage DC-1 (at the end of the output of the latch pulses to the FF's 26 to 30) is input, the Q output terminal of the FF 20 goes Low and the Q output terminal of the FF 21 goes High, and its inverted Q output terminal goes Low. The last bit of serial data DS for the initial stage DC-1 is therefore latched by the FF 30, and is transmitted to the driver 7. The Low signal at the inverted Q output of the FF 21 is input to the first input terminal of the AND gate A41, and the output signal from the AND gate A41 is input to the second input terminal of the AND gate A40 and the first input terminal of the AND gate A42, to fix the outputs of the AND gates A40 and A42. In the initial stage DC-1, when reading of all the bits of serial data DS for the initial stage sent from the data generator is completed, input of the serial data DS and the clock pulse CP is prohibited, and the consumption current does not flow at all through the shift register 5, the data latch circuit 1, the data input control circuit 50, and the clock control circuit 3.

In the next stage DC-2, responsive to the trailing edge of clock pulse CP last input to the initial stage DC-1, the FF 12 reads the High signal at the data input terminal and outputs it via its Q output terminal, and to the second input terminal of the OR gate 13. Responsive to this High signal, the OR gate 13 outputs a High signal, which is output to the second input terminal of the AND gate A41. Input to the first input terminal of the AND gate A41 is the inverted Q output of the FF 21. The inverter Q output of the FF 21 is initially reset by the latch pulse LP to the High level. The output of the AND gate A41 is therefore High, and is transmitted to the second input terminal of the AND gate A40 and the first input terminal of the AND gate A42, to allow the passage of the data DS and clock pulse CP. Responsive to the first cock pulse CP for the next stage after the clock pulses CP for the initial stage DC-1, which is the first clock pulse input to the next stage, (hereinafter referred to as "first pulse for the next stage"), the serial data DS is transmitted via the AND gate A42 and the AND gate 16 to the latch input terminal of the FF 26, and is thus read in the FF 26, and transmitted to the driver 7. Responsive to the first clock pulse for the next stage, the FF 15 reads the Low signal and its Q output goes Low, and the FF 17 reads a High signal.

The clock pulses CP and the serial data DS which are thereafter sent from the data generator are latched by the FF's 27 to 30 in the same way as in the initial stage. After the transfer of the third data as counted from the end of the serial data transmitted to the next stage DC-2, the R-S FF 61 is set, and the enable signal having been inverted at the inverter 24 to the Low level is transmitted to the third-stage drive unit. After the transfer of the last serial data for the next stage DC-2, the output of the AND gate A41 goes Low, and responsive to this Low level, the outputs of the AND gates A40 and A42 are fixed at the Low level to block the input of the serial data DS and the clock pulse CP, so that the consumption current does not flow at all through the shift register 5, the data latch circuit 1, the data input circuit 50 and the clock control circuit 3.

The third, the fourth, and further stages operate in the same way, and after the transfer of the last bit of serial data, the latch pulse LP is generated, and is input to the latch input terminals L of the drivers 7 in all the drive units DC-1 to DC-N, and the data signals in the FF's 26 to 30 are latched and output to the output terminals 32 to 36, to complete a cycle of operation.

As has been described, according to the embodiment of FIG. 4 and FIG. 5, only during the transfer of data, the data latch circuit 1 and the shift register 5 operate, and input to the data input control circuit 50 and the clock pulse control circuit 3 is gated through, and they operate without abnormality. When not selected, and the data transfer input is not made, the data latch circuit 1 and the shift register 5 halt, and the input to the data input control circuit 50 and the clock pulse control circuit 3 is blocked. Accordingly, under the conditions in which the powder supply for the logic circuit is 5 V, the power supply for the drive unit is 40 V, the LCD load is not connected, and the clock pulse frequency is 3 MHz, the consumption current is about 5 mA when selected, and is about 1 mA when not selected.

If eight IC's using the conventional drive units are employed, the system consumption current is:

$$5+2\times 7=19 \text{ mA}.$$

When the invention is adopted, it is $$5+1\times 7=12 \text{ mA}$$

This is a decrease to about 63%.

Figure 6:
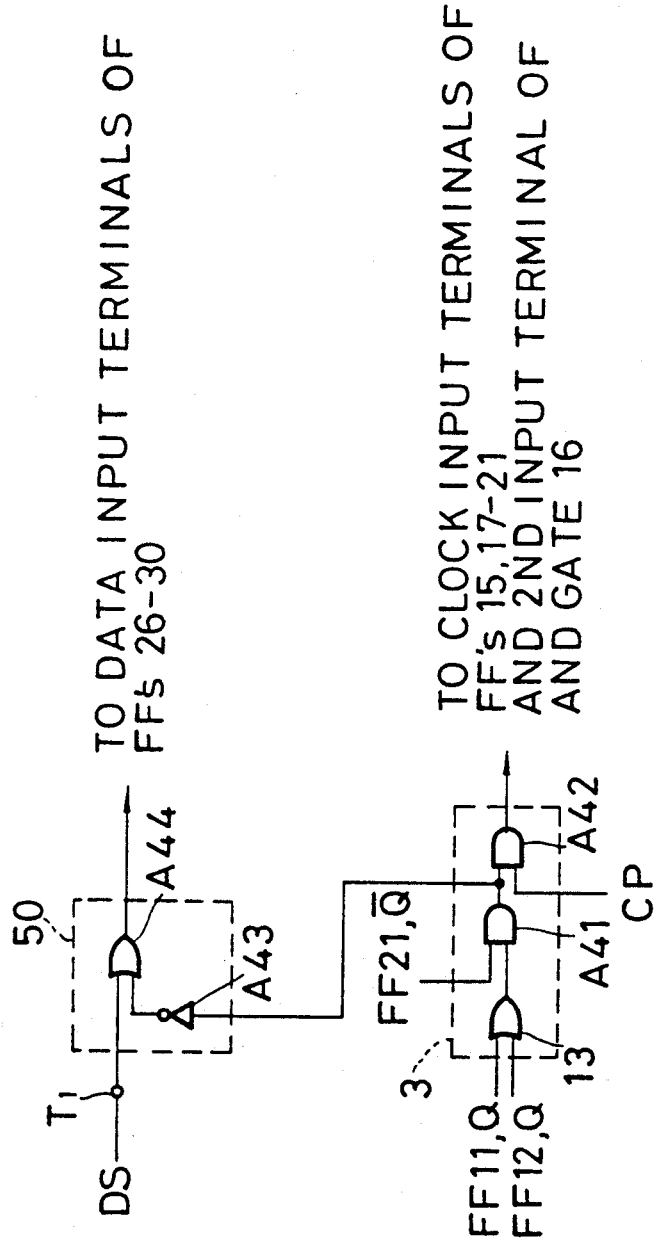
FIG. 6 to FIG. 8 are circuit diagrams showing further embodiments of the invention.

In the drive unit of FIG. 4, the data input control circuit 50 is formed of the AND gate A40. It may alternatively be formed of an OR gate, but still similar effects are obtained. FIG. 6 shows an example of such a modification, and in particular illustrates the part corresponding to the data input control circuit 50 and the clock control circuit 3 in FIG. 4. Since the remaining parts are identical to those of FIG. 4, their illustration is omitted.

The data input terminal T1 in FIG. 6 is connected to the first input terminal of the OR gate A44 forming the data input control circuit 50, and the output signal of the AND gate A41 of the clock control circuit 3 is connected via the inverter A43 to the second input terminal of the OR gate A44. The output of the OR gate A44 is connected to the data input terminals of the FF's 26 to 30. The difference from the operation of FIG. 5 is that, when selected, the output of the AND gate A41 is High and this High signal is inverted at the inverter A43 to a Low signal, which is connected to the second input terminal of the OR gate A44. The signal of the data input terminal T1 is transmitted via the OR gate A44 to the data input terminals of the FF's 26 to 30.

When not selected, the output of the AND gate A41 is Low and the Low signal is inverted at the inverter A43 to a High signal which is connected to the second input terminal of the OR gate A44, so the output of the OR gate A43 is High regardless of the signal at the data input terminal T1, and the output of the OR gate A44 is High, and is transmitted to the data input terminals of the FF's 26 to 30. Thus, the level in the non-selected state of the data input control circuit 50 is High, but the effects similar to those of the drive unit of FIG. 4 can be obtained.

Figure 7:
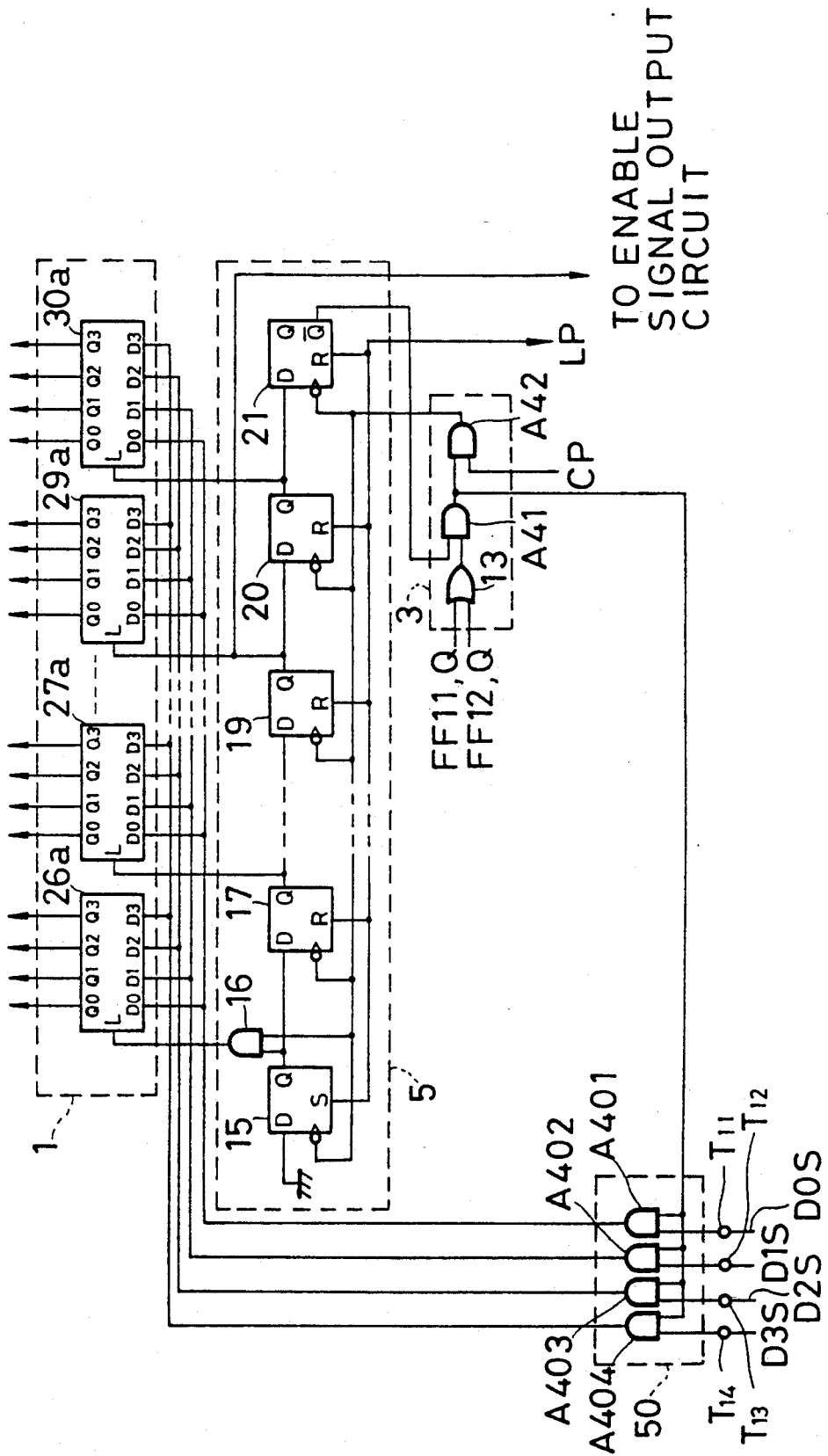

The configuration for the case in which four bits of serial data are sent at once from the data generator is shown in FIG. 7. For the case of eight bits, twelve bits, and so on, only the number of the gates forming the data input control circuit needs to be varied, so the description is omitted.

FIG. 7 shows the part corresponding to the data input control circuit 50, the clock pulse control circuit 3, the data latch circuit 1, and the shift register 5 of FIG. 4. The remaining parts are identical to those of FIG. 4, so their illustration is omitted. The data input terminals T11, T12, T13 and T14 in FIG. 7 are respectively connected to the first input terminals of the two-input AND gates A401, A402, A403 and A404 forming the data input control circuit 50. The outputs of the AND gate A41 of the clock control circuit 3 are connected to the second input terminals of the AND gates A401, A402, A403 and A404. The outputs of the AND gates A401, A401, A403 and A404 are connected to the data input terminals D0, D1, D2 and D3 of the 4-bit data FF's 26a to 30a, and the Q outputs Q0, Q1, Q2 and Q3 of the 4-bit data FF's 26a and 30a are connected to the driver 7. The latch signal for the 4-bit FF's 26a is connected to the output terminal of the AND gate 16 of the shift register. The latch signal for the 4-bit FF 27a is connected to the Q output terminal of the FF 17. The latch signal for the 4-bit FF 29 is connected to the Q output terminal of the FF 19. The latch signal for the 4-bit FF 30a is connected to the Q output signal for the FF 20. The difference from FIG. 4 is that four bits, D0S, D1S, D2S and D3S, of data are simultaneously input, and the number of the two-input AND gates forming the data input control circuit 50 is increased to 4 (A401, A402, A403 and A404), and the FF's 26 to 30 reading the output signals of the input data control circuit responsive to the latch signal output form the shift register 5 comprise data latches for four-bit data instead of one-bit data.

With the use of the four bits of serial data, the rate of transfer of data with the frequency of the clock pulses CP identical to that of FIG. 4 is four times, and an LCD with a display screen size for 4 times as large compared with the one bit of serial data can be driven. Moreover, the part operating in the non-selected state is identical to that shown in FIG. 4, and other part is not operating at all, so the consumption current is identical to that of FIG. 4.

Under the condition in which the power supply for the logic part is 5 V, the power supply for the LCD drive part is 40 V, the LCD load is not connected, and the frequency of the clock pulses is 3 MHz, the consumption current is about 7.25 mA in the selected state, and is about 1 mA in the non-selected state. (In the prior art, it is about 7.25 mA in the selected state and is about 4.25 mA in the non-selected state). If eight IC's using conventional drive units are used, the system consumption current is $$7.25 + 4.25 \times 7 = 37 \text{ mA},$$

where it is $$7.25 + 1 \times 7 = 14.25 \text{ mA}$$

in the invention. This is a decrease to about 38.5%.

In the case of the eight bits of serial data, twelve bits of serial data, the consumption currents are as shown in the following table.

TABLE 1

| CONSUMPTION CURRENT WITH CLOCK PULSE FREQUENCY OF 3 MHz | | | | | | | | |
|---|---|---|---|---|---|---|---|---|
| | Prior Art | Invention | Prior Art | Invention | Prior Art | Invention | Prior Art | Invention |
| Number of Bits in Serial Data | 1 Bit | | 4 Bits | | 8 Bits | | 12 Bits | |
| Consumption Current in Selected State | 5 mA | 5 mA | 7.25 mA | 7.25 mA | 10.25 mA | 10.25 mA | 13.25 mA | 13.25 mA |
| Consumption Current in Non-selected State | 2 mA | 1 mA | 4.25 mA | 1 mA | 7.25 mA | 1 mA | 10.25 mA | 1 mA |
| Consumption Current of A System Comprising 8 chips | 19 mA | 12 mA | 37 mA | 14.25 mA | 61 mA | 17.25 mA | 85 mA | 20.25 mA |
| Invention/Prior Art | 63% | | 39% | | 28% | | 24% | |

Accordingly, in the event of increase in the frequency of the clock pulses for the data transfer and increase in the number of bits of the serial data, in line with the increase in the screen size of the LCD or the like, the data input control circuit is provided in the serial data input part, and together with the clock pulse control circuit the data input is controlled, and, only when selected, the input of data and clock pulses is gated through, and data latch circuit and the shift register are operated, while when non-selected input of the clock pulses is blocked, and the operation of the data latch circuit and the shift register halt, and the internal conductor's logic level is fixed, and the operation consumption current of the data input buffer and the charging and discharging current of the wiring capacitance and the input capacitance of the data latch circuit halt, so the consumption current of the entire system can be substantially reduced.

As has been described, according to the above embodiments, a gate circuit is provided to receive the drive data input serially, and the end signal that is output from the shift register when the latch of the data into the data latch circuit is completed, or the non-operation judgement output from the judgement circuit for discriminating between operation and non-operation, so it is possible to halt, together with the clock pulse, the operation of the data latch circuit or the shift register in the non-operative drive unit in the cascade connection, and halt the charging and discharging currents in these circuits, so that the consumption current of the entire system for the LCD can be substantially reduced.

A further embodiment of the invention will now be described with reference to FIG. 8 and FIG. 9. The configuration of the overall drive system of this embodiment is as shown in FIG. 1, and this embodiment differs from the prior-art system in the configuration of part of the circuits within each of the drive units DC-1 to DC-N.

Figure 8:
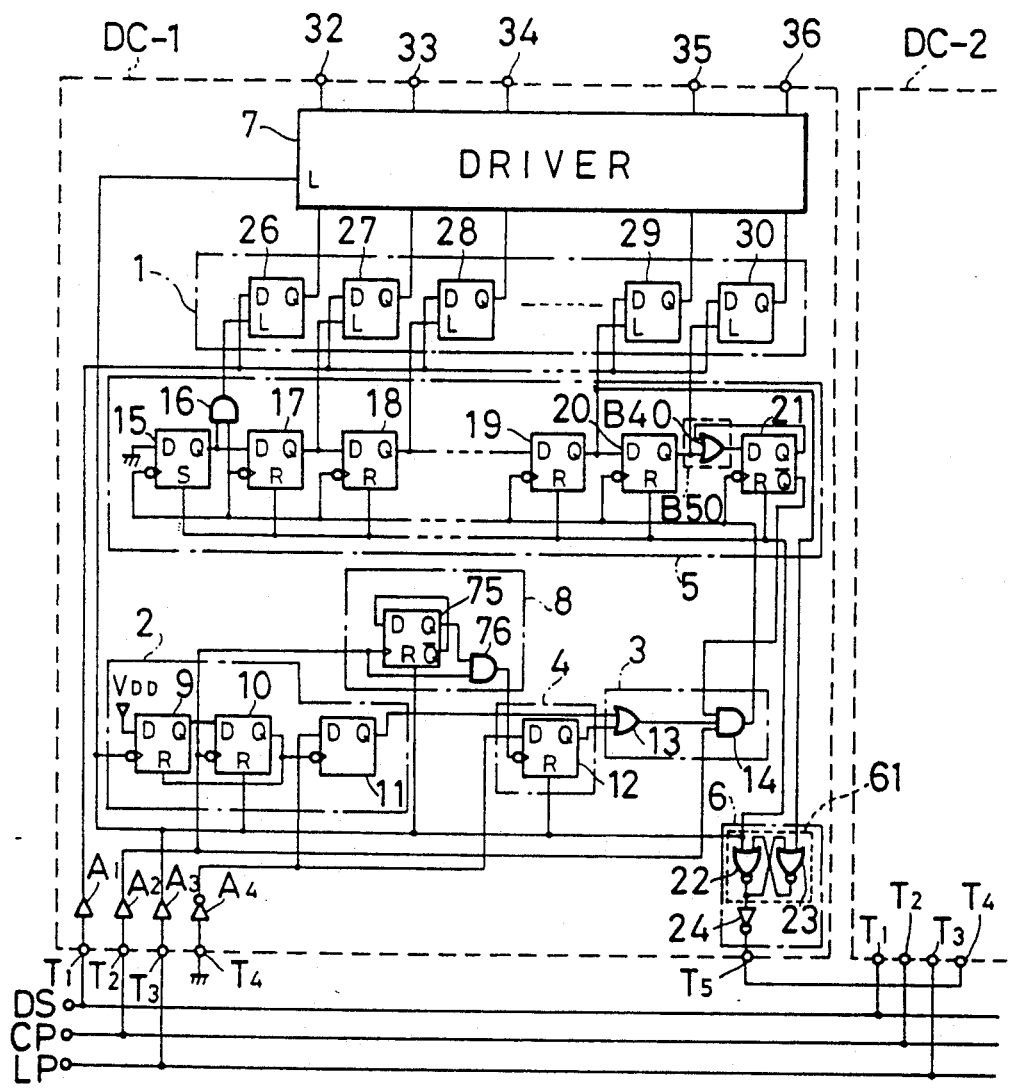

FIG. 8 shows the circuit configuration of the drive unit DC-1. Other drive units DC-2 to DC-N have identical configuration so their illustration is omitted. In the circuit of FIG. 8, the parts identical to those in FIG. 2 are given identical reference numerals and their description is omitted.

In the following description, the second stage in the cascade connection is called a next stage, and also represents the third and subsequent stages, and the description on the second stage is mostly applicable to the third and subsequent stages.

In FIG. 8, serial data DS serially sent from a data generator, not shown, are respectively applied to the input terminals T1 of the drive units in the respective stages, DC-1 to DC-N. The clock pulses CP input in synchronism with the serial data DS are applied to the input terminals T2 of the respective stages, and the latch pulse LP for latching the serial data DS is applied to the input terminals T3 of the respective stages. The enable signal is output from the driver terminal T5 of each stage, and applied to the terminal T4 of the next stage. In the case of the initial-stage drive unit DC-1, there is no preceding stage, and the enable input terminal T4 is grounded (connected to the Low level). The serial data DS applied to the input terminal T1 is connected via the buffer A1 to the data input terminals of the plurality of FF's 26 to 30 serving as latching means in the data latch circuit 1. The FF's 26 to 30 may be formed of data flip-flops (D-FF) or data latches (D-latches). The latch pulse LP applied to the input terminal T3 is supplied via the buffer A3 to the operation/non-operation discrimination circuit 2, the frequency divider circuit 8, the enable latch or judgement circuit 4, the enable signal output circuit 6, the shift register 5, and the latching driver 7.

The shift register 5 is comprised of FF's 15 and 17 to 21, and the latch pulse LP is applied to the set input terminal S of the FF 15 and the reset input terminal R of the FF's 17 to 21. These FF's 15 and 17 to 21 are so connected that the signals output from the output terminals Q of the respective FF's are connected to the data input terminals of the next FF's. The Q output of the FF 20 produces a latch complete signal of a predetermined level which is output at the time of completion of the output of the latch signal to the FF's 26 to 30, and is connected to the first input terminal of the OR data B40 forming the gate circuit B50. The data terminal D of the initial FF 15 is grounded (connected to the Low level).

The Q outputs of the FF's 17 to 20 in shift register 5 are applied to the latch input terminals L of the FF's 27 to 30 forming the data latch circuit 1.

The Q output of the FF 15 is connected to the first input terminal of the AND gate 16, and its output is input to the latch terminal L of the FF 26 in the data latch circuit 1.

The clock pulse CP applied to the clock input terminal T2 is supplied via the buffer A2 to the operation/non-operation discrimination circuit 2, the frequency divider circuit 8 and the clock control circuit 3. The operation/non-operation discrimination circuit 2 is comprised of FF's 9, 10 and 11. The data input terminal of the FF 9 is connected to $V_{DD}$ (High level), and input to its clock input terminal is the latch pulse LP. The Q output of the FF 9 is connected to the data input of the FF 10, and input to the clock input terminal of the FF 10 is the clock pulse CP. Input to the reset terminal R of the FF 10 is the latch pulse LP, and the Q output is connected to the reset input of the FF 10 terminal R of the FF 9 and the clock input terminal of the FF 11. Input to the data input terminal of the FF 11 is an enable signal, which is obtained by inverting, at the inverter A4, the Low signal at the T4 input terminal into a High signal (in the initial stage), or the High signal at the T4 input terminal is inverted by the inverter A4 into a Low level signal (in the next stage). The Q output of the FF 11 is a clock control signal which is High for the initial stage and Low for the next stage. When there is an extra IC pin, the operation/non-operation discrimination circuit may be omitted and an input signal of a High level or a Low level may be input from the outside of the IC to indicate operation or non-operation.

The frequency divider circuit 8 is comprised of a FF 75 and a AND gate 76. The inverted Q output terminal of the FF 75 is connected to the D (data) input terminal, so it operates as a T-flip-flop (T-FF). Input to the clock input terminal of the FF 75 is a clock pulse CP and the FF 75 operates at the falling edge (a trailing edge) of the clock pulse. The Q output terminal of the FF 75 is connected to the first input terminal of the AND gate 76, and the clock pulse CP is connected to the second input terminal of the AND gate 76. The output terminal of the AND gate 76 is connected to the clock input terminal of the FF 12 in the enable latch circuit 4. Input to the FF 12 is the enable signal. (The FF 75 and the AND gate 76 may be omitted by connecting the clock pulse CP to the clock input terminal of the FF 12.) The Q output of the FF 11 is connected to the first input terminal of the OR gate 13 in the clock control circuit 3, the Q output of the FF 12 is connected to the second input terminal of the OR gate 13, the output of the OR gate 13 is connected to the second input terminal of the AND gate 14. Connected to the first input terminal of the AND gate 14 is the inverted Q output of the FF 21. The clock pulse CP is input to the third input terminal of the AND gate 14 is connected to the clock input terminals of the FF's 15 and 17 to 21 and the second input terminal of the AND gate 16. The enable output circuit 6 is comprised of two-input NOR gates 22 and 23 and an inverter 24. Input to the first input terminal of the NOR gate 22 is a latch pulse LP, and connected to the second input terminal is the output of the NOR gate 23. The output terminal of the NOR gate 22 is connected to the first input terminal of the NOR gate 23 and the connected via the inverter 24 to the enable output terminal T5. Connected to the second input terminal of the NOR gate 23 is the Q output terminal of the FF 19. (When the flip-flop 75 and the AND gate 76 are omitted, as described above, it is necessary for the Q output terminal of the FF 20 to be connected to the second input terminal of the NOR gate 23.) Connected to the L input terminal of the latching drive 7 is the latch pulse LP, and the input from the Q outputs of the FF's 26 to 30 of the data latch circuit 1 are connected via the drive 7 to the output terminals 32 to 36.

The operation of the cascade connection will now be described with reference to the waveform diagram of FIG. 9.

Figure 9:
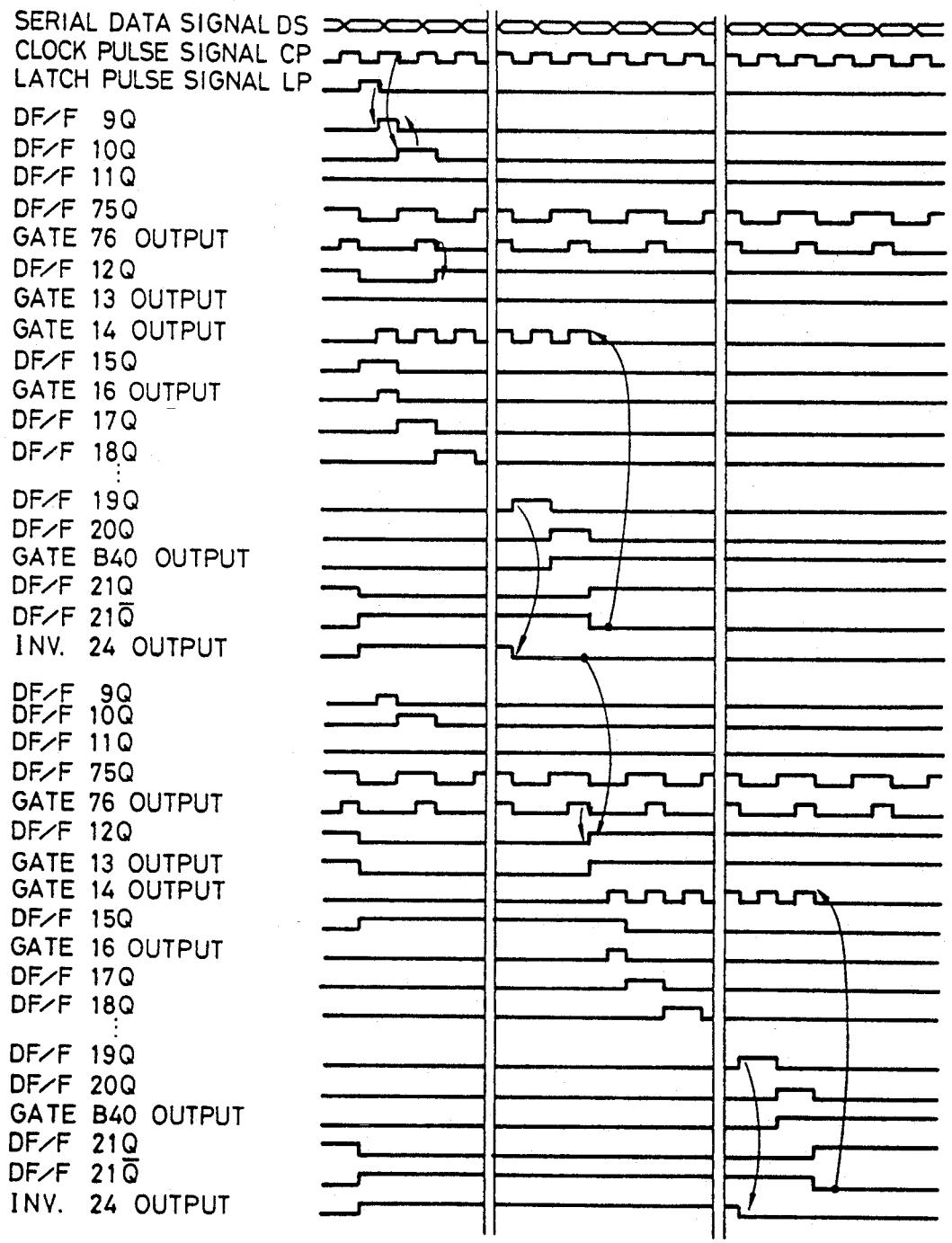
FIG. 9 is a waveform diagram showing the operation of the embodiment of FIG. 8.

The serial data signals DS, the clock pulses CP and the latch pulse signal LP are of the waveforms as shown in FIG. 9, with the waveforms being continuous.

The operation/non-operation discrimination circuit 2 performs its operation by having the FF 11 read and output, via its Q output terminal, the signal obtained by inverting the signal at the enable input terminal at the falling edge of the second clock after the latch pulse LP is input, in the same way as in the prior art. In the initial stage, the High level is read and output via the Q output of the FF 11. The R-S FF 61 is reset by the latch pulse LP. The output signal is inverted by the inverter 24 to become a High signal, which serves as an enable signal input for the next stage. The FF 11 in the next drive unit stage reads the Low level signal obtained by inversion by the inverter A4. The Low level signal is then output via the Q output of the FF 11. Thus, "High" is found in the initial drive unit stage and "Low" is found in the next drive unit stage.

In the initial stage DC-1, the Q output of the FF 11 is High, so the output of the OR gate 13 is fixed at the High level. In the next stage DC-2, the Q output of the FF 11 is Low so the output of the OR gate 13 is determined by the Q output of the FF 12. The frequency divider circuit 8 is initially reset by the latch pulse LP, and operates to permit passage of the even clock pulses CP which are thereafter input. At the trailing edge of the clock, the FF 12 of the enable latch circuit 4 reads a High signal in the case of the initial stage DC-1 and a Low signal in the case of the next stage DC-2, and the read signal is input to the second input of the OR gate 13. (In the case of the initial stage, the enable input terminal T4 is fixed at the Low level, so the subsequent operation is identical, and its description is therefor omitted.) Accordingly, the inputs of the OR gate 13 in the next stage are both Low, its output is therefore Low, the output of the AND gate 14 in the next stage is fixed at the Low level. In other words, in the next stage, the input of the clock pulse CP is blocked and the output of the AND gate 14 is fixed at the Low level, and the circuit is held in the static state, so the consumption current does not flow at all through the shift register 5, the data latch circuit 1 and the clock control circuit 3.

In the initial stage DC-1, the second input terminal of the AND gate 14 is High, and the inverted Q of the FF 21 connected to the first input terminal is High because of the initial reset by means of the latch pulse LP. The AND gate 14 permits the passage of the clock pulses CP from its third input terminal to its output.

In each of the initial stage DC-1 and the next stage DC-2, the FF 15 is set by the latch pulse LP, so its Q output is High, while other FF's 17 to 21 are reset by the latch pulse LP and their Q outputs are Low. The two inputs of the OR gate B40 forming the gate circuit B50 are both Low, so the OR gate B40 outputs a Low signal (first level) to the data input terminal of the FF 21.

Accordingly, the first input terminal of the AND gate 16 of the initial stage is made High to permit passage of the output pulse (shift clock) of the AND gate 14 to the latch input terminal L of the FF 26 as a latch signal. (Where the FF's 26 to 30 are formed of data latches, it is necessary to provide the AND gate 16 to prevent the latch input signal of the FF 26 from being High, as described above. Where the FF's 26 to 30 are formed of data flip-flops the data are read at the edges of the clocks so the AND gate 16 is unnecessary.) In the next drive unit stage, the output of the AND gate 14 is fixed at the Low level, so the latch signal to the data latch circuit 1 is blocked.

In the initial drive unit stage the AND gate 14 gates signals through, so the pulse CP is passed through the AND gates 14 and 16, and transmitted to the latch input terminal of the FF 26. The serial data DS input in synchronism with the clock pulse CP is passed through the buffer A1, and input to the data input of the FF's 26 to 30, so responsive to the clock pulse CP first input after the input of the latch pulse LP in the initial stage DC-1, the FF 26 reads the serial data DS and transfer it to the driver 7. At the trailing edge of the clock pulse, the FF 15 reads the Low signal, and outputs it via its Q output, so the AND gate 16 is blocked, and the shift clock pulses (shift clock pulses CP) which are thereafter output from the AND gate 14 is not transmitted to the FF 26. At the trailing edge of the shift clock pulse, the FF 17 reads the High signal at its D terminal and outputs it via its Q output. Next, the second clock pulse CP input after the latch pulse LP is input is transmitted via the AND gate 14 to the shift register 5. At the trailing edge of the pulse, the FF 17 reads the Low signal, and makes it Q output Low and the FF 18 reads a High signal, making its Q output High. The FF 27 to which the High Q output of the FF 17 has been transmitted reads the serial data DS being input and transmits it via its Q output to the drive 7.

Subsequently, responsive to the third clock pulse CP after the latch pulse is input, the FF 28 reads the serial data responsive to the Q output signal of the FF 18 and outputs it to the driver 7. As the above operation is continued and when the third bit as counted from the end of the serial data to be sent to the initial stage DC-1 is transmitted to the driver 7, the Q output of the FF 19 goes High and, responsive to this signal, the R-S FF 61 is set, and produces a High signal, which is inverted by the inverter 24 to become a Low signal, which is output via the terminal T5. The enable signal (Low level) output via the terminal T5 is input to the enable signal input terminal T4 of the next stage DC-2, and passed via the inverter A4 to the data (D) input terminals of the FF's 11 and 12. A pulse is input to the clock input terminal of the FF 12, but the enable signal is associated with the delay through the AND gate 14, the FF 19, the NOR gates 22 and 23, and the inverter 24 in the initial stage, so that the transition at this instance cannot be read.

When the second clock pulse as counted from the end of the data to be sent to the initial stage DC-1 is input, the Q output terminal of the FF 19 goes Low and the Q output terminal of the FF 20 goes High. The second bit as counted from the end of the serial data DS for the initial stage DC-1 is latched by the FF 29 and is transmitted to the driver 7. The High Q output of the FF 20 is sent not only to the L input terminal of the FF 30 but also to the second input terminal of the OR gate B40, as a latch complete signal. Responsive to the High signal input of the second input terminal, the OR gate B40 outputs a High signal (second level) to the data input terminal of the FF 21. In the next stage, no pulse is then output from the AND gate 76, so the FF 12 does not read the High signal on the data input terminal, and the second input terminal of the AND gate 14 is held Low and the clock pulse CP input is blocked. When the last clock pulse of for the initial stage DC-1 is input the Q output terminal of the FF 20 goes Low. The last bit or serial data DS for the initial stage DC-1 is therefore latched by the FF 30, and is transmitted to the driver 7. The second input terminal of the OR gate B40 forming the gate circuit B50 goes Low, but the Q output of the FF 21 goes High, and this is input to the first input terminal of the OR gate B40. The output of the OR gate B40, i.e., the D input terminal of the FF 21, is held at the High level. The inverted Q output of the FF 21 (first clock control signal) as the end signal goes Low and is input to the first input terminal of the AND gate 14, and the output of the AND gate 14 is fixed to the Low level. In the initial stage DC-1, when reading of all the bits of serial data for the initial stage sent from the data generator is completed, input of the clock pulse CP is prohibited, and the consumption current does not flow at all through the shift register 5, and the clock control circuit 3. When the Q output of the FF 21 goes High, the D input terminal of the FF 21 is held at the High level, and the transition of the inverted Q output of the FF 21 from the High level to the Low level is transmitted to the first input terminal of the AND gate 14, being delayed because of the propagation delay with respect to the rise of the clock pulse CP next to the last clock, an additional pulse may be generated after the last clock pulse CP for the initial stage. But as the FF 21 reads the High signal at its D input terminal, in the period in which either of the two inputs of the OR gate B40 is High, the inverted Q output, as the end signal, of the FF 21 is held at the Low level, and will not return to the High level. Accordingly, the first input terminal of the AND gate 14 is Low, and the input of the clock pulses CP is blocked.

In the next stage DC-2, responsive to the trailing edge of clock pulse CP last input to the initial stage DC-1, the FF 12 reads the High signal at the data input terminal and outputs it via its Q output terminal, and to the second input terminal of the OR gate 13. Responsive to this High signal, the OR gate 13 outputs a High signal, which is output to the second input terminal of the AND gate 14. Input to the first input terminal of the AND gate 14 is the inverted Q output of the FF 21. This level is already High because of the initial reset by the latch pulse LP, so the AND gate 14 nullifies the prohibition of the input of the clock pulses CP. Responsive to the first clock pulse CP input to the next stage after the clock clock pulses CP for the initial stage DC-1, the serial data DS is transmitted via the AND gate 14 and the AND gate 16 to the latch input terminal of the FF 26, and is thus read in the FF 26, and transmitted to the driver 7. Responsive to the first clock pulse for the next stage, the FF 15 reads the Low signal and its Q output goes Low, and the FF 17 reads a High signal.

The clock pulses CP and the serial data DS which are thereafter sent from the data generator are latched by the FF's 27 to 30 in the same way as int he initial stage. After the transfer of the third bit as counted from the end of the serial data transmitted to the next stage DC-2, the R-S FF 61 is set, and the enable signal having been inverted at the inverter 24 to the Low level is transmitted to the third-stage drive unit. When the Q output of the FF 21 goes High after the transfer of the last serial bit of serial data for the next stage DC-2, a High signal is transmitted to the D input terminal of the FF 21, as in the initial stage DC-1.

The Low inverted Q output of the FF 21 is transmitted to the first input terminal of the AND gate 14. When this Low signal is delayed with reference to the rise of the clock pulse CP next to the last clock pulse for the next stage DC-2, an additional pulse may be generated after the last clock pulse for the next stage. But the flip-flop 21 holds the inverted Q output Low, having read the High D input terminal, so it is ensured that the first input terminal of the AND gate 14 be Low, prohibiting the input of the clock pulse CP. Accordingly, the consumption current does not flow at all through the shift register 5 and the clock control circuit 3.

The third, the fourth, and further stages operate in the same way, and after the transfer of the last bit, the latch pulse LP is input to the latch input terminals of the drivers 7 of all the drive units DC-1 to DC-N, and the data signals in the FF's 26 to 30 are latched and output to the output terminals 32 to 36, to complete a cycle of operation.

The relationship between the propagation delay time and the fact that it is ensured that the clock pulses be prohibited will now be described in detail with the reference to FIG. 10A and FIG. 10B. The operation after the output of the OR gate 13 in FIG. 8, i.e., the level of the second input terminal of the AND gate 14 goes High is identical between the initial stage and the next stage, so no distinction will be made between the initial stage and the next stage, but the operation with regard to the blocking of the clock pulses CP will be described.

Figure 10A:
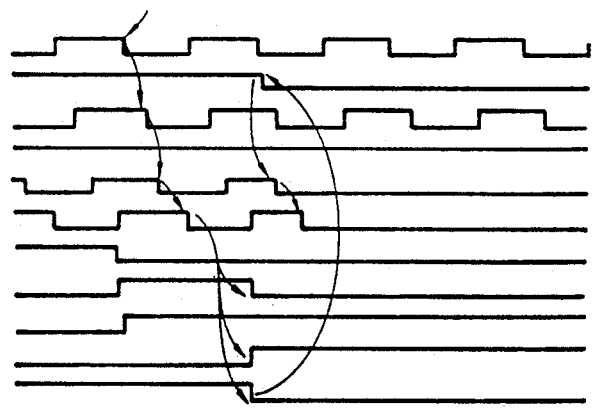
Figure 10B:
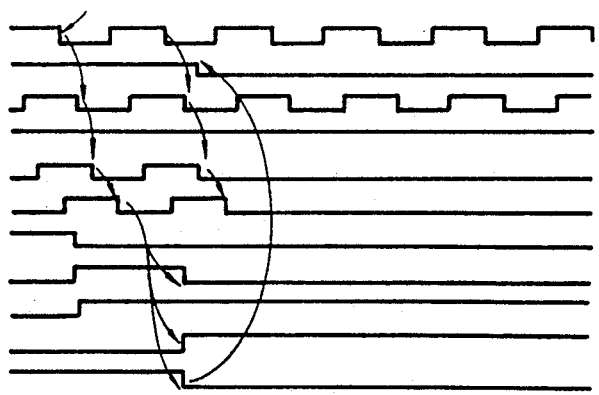

FIG. 10A and FIG. 10B show the operation after the last clock pulse CP for a drive unit rises, for the case of the frequency of the clock pulses being 6 MHz and 12 MHz, respectively.

When the frequency of the clock pulses CP is 6 MHz, as shown in FIG. 10A, since the FF 12 is reset by the latch pulse LP, a Low signal is output from its Q output and a High signal is output from its inverted Q output. The High inverted Q output is input to the first input terminal of the AND gate 14, while the second input terminal of the AND gate 14 is already High, so the output of the AND gate 14 will be identical to the third input of the AND gate 14.

Immediately before the last bit of serial data DS is latched by the data latch 30, the D input of the FF 20 is Low, and the Q output is High. This High signal is input to the second input terminal of the OR gate B40 forming the gate circuit B50, so the D input of the FF 21 is High.

When, in this state, the last clock pulse CP is input, the Q output of the FF 20 is Low, and the Q output of the FF 21 is High and its inverted Q output is Low. The High Q output of the FF 21 is input to the first input terminal of the OR gate B40, and is thereby input to the D input terminal of the FF 21, so even when the Q output of the FF 20 goes Low, the D input terminal is kept High, The Low inverted Q output of the FF 21 is transmitted to the first input terminal of the AND gate 14. But, because of the sum of the signal propagation delays from the third input terminal to the output terminal, the wiring conductor for the shift clock pulse (the delay of the signal due to the load capacitance of the wiring conductor and the FF's 15 and 17 to 21), the inverted Q output of the FF 21 with respect to the clock input terminal of the FF 21, the wiring conductor from the Q output of the FF 21 to the first input terminal of the AND gate 14 (the delay of the signal due to the load capacitance of the wiring conductor and the AND gate 14) is about 88 ns, the second input terminal of the AND gate 14 goes High about 5 ns before the first input terminal of the AND gate 14 is fixed to the Low level. (The period corresponding to 6 MHz is about 166.7 ns, but with the duty of 50%, the period for which the clock pulse is Low is about 83 ns). This High level of the clock pulse CP is transmitted via the AND gate 14 to the clock pulse input terminal of the FF's 15, 17 to 21.

5 ns after the output of the AND gate 14 goes High, the Low input to the first input terminal of the AND gate 14 makes the output of the AND gate 14 Low. As will be understood from the above description, a spike-like pulse of 5 ns wide appears in the output of the AND gate 14. The spike-like pulse is input to the clock input terminals of the FF's 15 and 17 to 21, but as the D input of the FF's 15 and 17 to 21 are all Low, even if they are read the levels of the D input terminals, their Q outputs are maintained Low. The High Q output of the FF 21 is transmitted to the D input of the FF 21 via the OR gate B40 as described above. Even if the FF 21 reads the level at its D input terminal, its Q output and inverted Q output are maintained High and Low, respectively. Even if the frequency of the clock pulses input to the drive unit is increased to 6 MHz, the FF's 15, 17 to 21 operate without abnormality, and the FF's 26 to 30 of the data latch circuit 1 hold the normal values (levels). Since these are output via the driver 7 to the outputs 32 to 36, the output data have normal values. The inverted Q output of the FF 21 is kept Low, so until the next latch pulse LP is input to the cascaded drive units, responsive to the first clock input control signal, it is ensured that the output of the AND gate 14 is fixed at the Low level, and the input of the clock pulses CP is blocked. In this state, if the power supply for the logic circuit is 5 V, the power supply for the drive units is 40 V, no LCD is connected as a load, the clock pulse frequency is about 3 MHz, the consumption current is about 5 mA in the state in which the clock pulses are accepted (the sate in which the clock pulses at the output of the AND gate 14 are not blocked due to the Low first clock input control signal), and it si about 2 mA in the sate in which the clock pulses are not accepted (the state in which the clock pulses are blocked). When the clock pulse frequency is increased to 6 MHz, the consumption current is about 10 mA in the state in which the clock pulses are accepted (the clock pulses are not blocked) and it is about 4 mA in the state in which the clock pulses are not accepted (the clock pulses are blocked. Thus, reduction of the power consumption is possible.

Description will now be made with reference to FIG. 10B of the case where the clock pulse frequency is about 12 MHz. In this case, about 88 ns after the last clock pulse input for a drive unit is input to the third input terminal of the AND gate 14, a Low signal is transmitted to the first input terminal of the AND gate 14, as in the case of the clock pulse frequency being 6 MHz. But as the period of the 12 MHz is 83 ns, the period for which the clock pulse is Low is about 42 ns, and before the output of the AND gate 14 is fixed to the Low level responsive to the inverted Q output (Low level) of the FF 21, another pulse having a width of about 42 ns is generated at the output of the AND gate 14, after the last clock pulse CP for the drive unit. Since however the High Q output of the FF 21 is transmitted via the OR gate B40 to the D input of the FF 21, as in the case of the clock pulse frequency being 6 MHz, even if the FF 21 reads the level at the D input terminal, the Q output and the inverted Q output remain Low. Accordingly, even if the clock pulse frequency is increased to about 12 MHz, the FF's 15 and 17 to 21 therefore operate without abnormality, and it is ensured that the output of the AND gate 14 is fixed to the Low level, and the input of the clock pulses CP is prohibited. In this state, if the clock pulse frequency is 12 MHz, and other conditions are unchanged, the consumption current is about 20 mA in the state in which the clock pulses are accepted, and is about 8 mA in the state in which the clock pulses are not accepted.

As is clear from the above description, it is evident that even if prohibition of the input of the clock pulse by mans of the inverted Q output of the FF 21 is delayed after the last clock pulse CP is input and a number of (e.g., two or more) pulses are input to the FF's 15, 17 to 21, the normal operation is ensured, the output of the AND gate 14 is fixed to the low level, and the input of the clock pulses CP is blocked. The maximum frequency of the drive unit is not determined by the timing of the first clock control signal shown in FIG. 8, and the frequency can be increased to the maximum operation frequency determined by other factors (e.g., the FF's 15 and 17 to 21), and a substantial reduction in power consumption can be achieved.

Description of the embodiment of FIG. 8 is thus completed. The data FF's 15 and 17 to 21 forming the shift register 5 may be such that they operate at the rising edges of the clock pulses CP. But as the only change is on the operation edges, further description is omitted.

Figure 11:
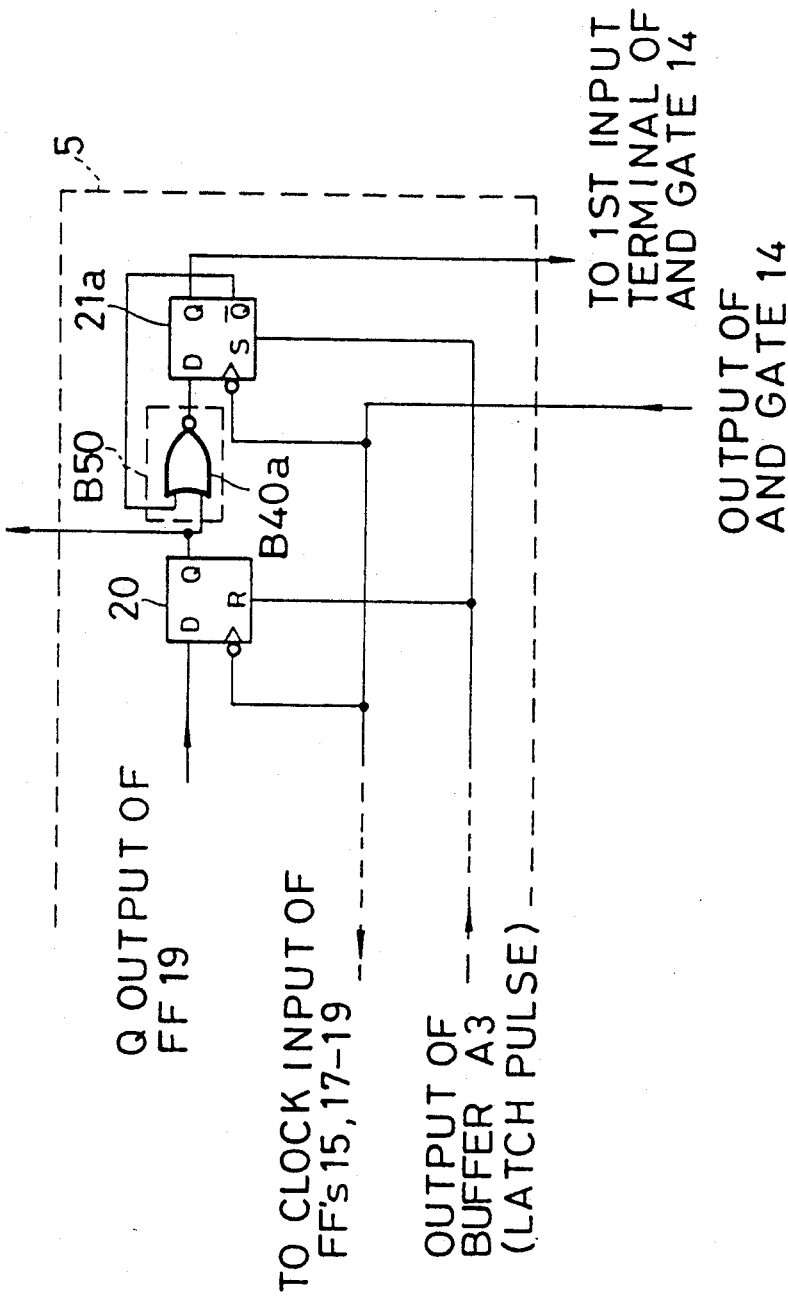
FIG. 11 to FIG. 14 are partial circuit diagrams showing further embodiments of the invention.

In the embodiment of FIG. 8, the gate circuit B50 is formed of the OR gate B40. It may alternatively be formed of a NOR gate, and yet the same effects are obtained. An example is shown in FIG. 11, as another embodiment. FIG. 11 shows part of the shift register 5 and the gate circuit B50. Other parts are identical to FIG. 8, and their illustration is omitted. Differing from the embodiment of FIG. 8, the latch pulse that is input to the FF 21a is input to the set input. Input to the first input terminal of the NOR gate B40a forming the gate circuit B50 is an inverted Q output of the FF 21a, and input to the second input terminal of the NOR gate B40a is the Q output of the FF 20. The rest of the connections are identical to those in FIG. 8. It will be evident that the operation is identical to that of the embodiment of FIG. 8 since the difference is that the latch pulse that is input to the FF21 is input to the set input terminal, the logic level of the signal input to the D input terminal is reverse to that of the embodiment of FIG. 8, and the levels of the Q output and the inverted Q output are opposite to those of the embodiment of FIG. 8.

Figure 12:
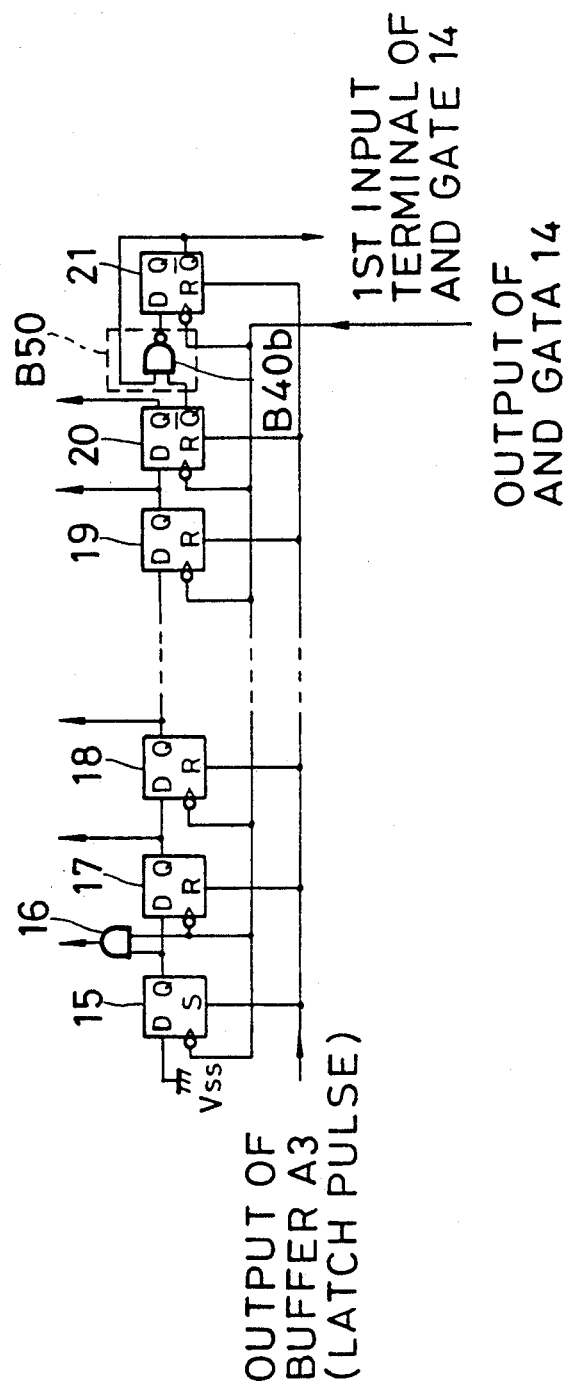

A further embodiment in which the gate circuit B50 is formed of a NAND gate B40b is shown in FIG. 12. FIG. 12 shows only the shift register 5 and the gate circuit B50, and illustration of other parts, which are identical to those in FIG. 8, is omitted. Input to the first input terminal of the NAND gate B40b is the inverted Q output of the FF 21, and input to the second input terminal is the inverted Q output of the FF 20, and the output of the NAND gate B40b is connected to the D input terminal of the FF 21. The rest of the connections are identical to those in FIG. 8. It will be evident that same effects are obtained since the only difference is that the logic levels at the part of the OR gate B40 of FIG. 8 have been altered, and the NAND gate B40b is used.

Figure 13:
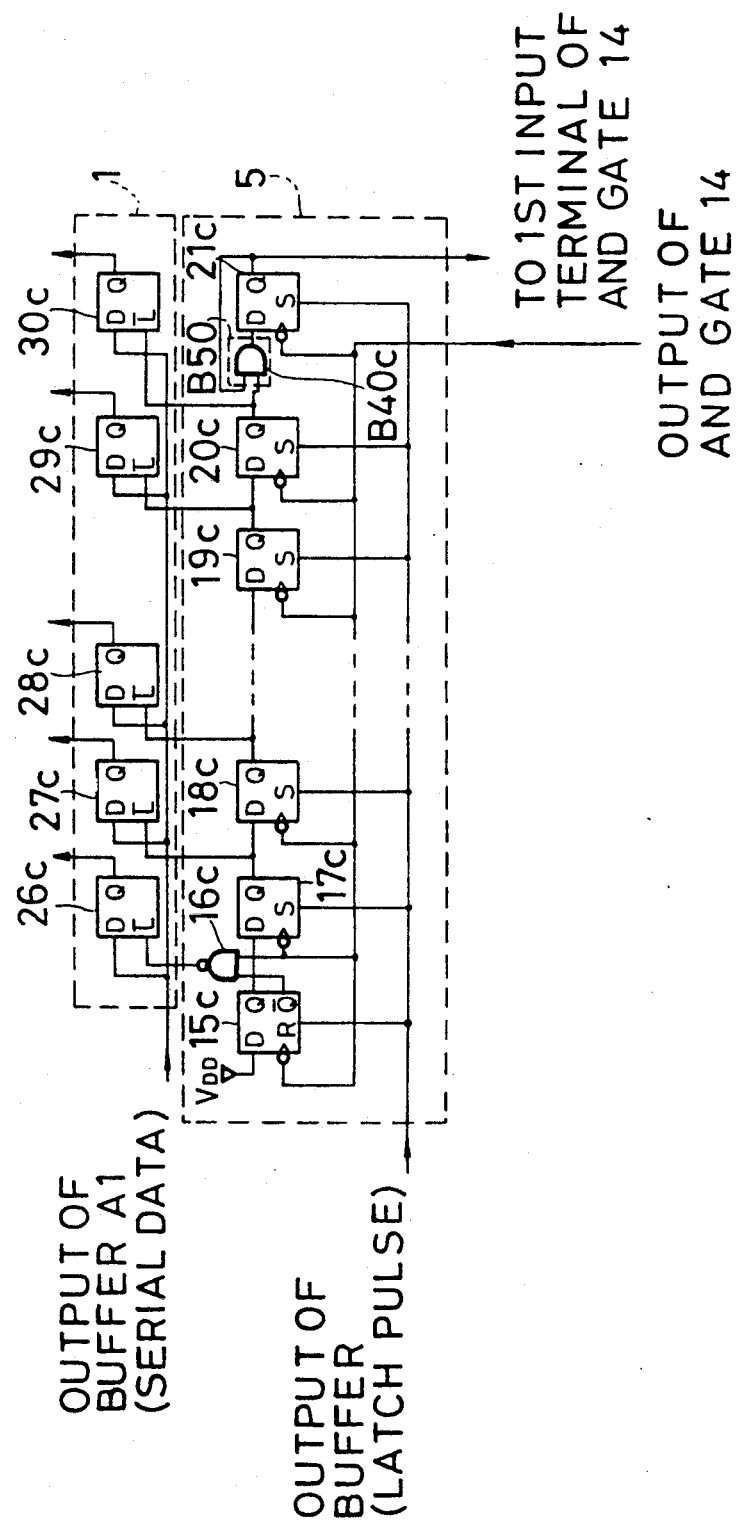

FIG. 13 shows a further embodiment which employs a data latch of the type which reads the serial data DS when the L input terminals of the FF's 26 to 30 go Low, and the gate circuit B50 is formed of an AND gate B40c. FIG. 13 shows only the shift register 5, the data latch circuit 1 and the gate circuit B50, and illustration of other parts, which are identical to those in FIG. 8, is omitted. Connected to the D input terminal of the FF 15c is $V_{DD}$ (High level), connected to the first input terminal of the NAND gate 16c is the inverted Q output of the FF 15c, connected to the second input terminal is the output of the AND gate 14, and the latch pulse LP input via the buffer A3 is connected to the reset input of the FF 15c and the set inputs of the FF's 17c to 21c. Connected to the first input terminal of the AND gate B40c forming the gate circuit B50 is the Q output of the FF 21c, connected to the second input terminal is the Q output of the FF 20c, and the Q output of the FF 21c is connected to the first input terminal of the AND gate 14, and the rest of the connections are identical to those in FIG. 8. When the latch pulse LP is input, the FF 15c is reset, and the FF's 17c to 21c are set. The detailed description of the operation of the parts is omitted, but immediately before the last serial data DS is latched by the data latch 30c, the D input of the FF 20c is High, and its Q output is Low. This Low signal is input to the second input terminal of the AND gate B40c forming the gate circuit B50, and the D input of the FF 21 is Low (second level). When, in this date, the last clock pulse CP is input, the Q output of the FF 20c is High, and the Q output of the FF 21 is Low. When this Low signal is input to the first input terminal of the AND gate B40c forming the gate circuit B50, a Low signal is input to the D input terminal of the FF 21c, so even if the Q output of the FF 20c is High, the D input terminal of the FF 21c is held Low, and the Q output is held Low. The Low signal at the Q output of the FF 21c is input to the first input terminal of the AND gate 14 to fix its output to the Low level. Effects identical to those of the embodiment of FIG. 8 are therefore obtained. (In this embodiment of FIG. 13, the elements 16c forming the shift register 5 is formed of a NAND gate, but it serves to prevent the latch input signal to the FF 26c from being Low. When the FF's 26c to 30c are formed of data FF's operating of the rising edges of the clock input, the NAND gate 16c can be omitted.)

Figure 14:
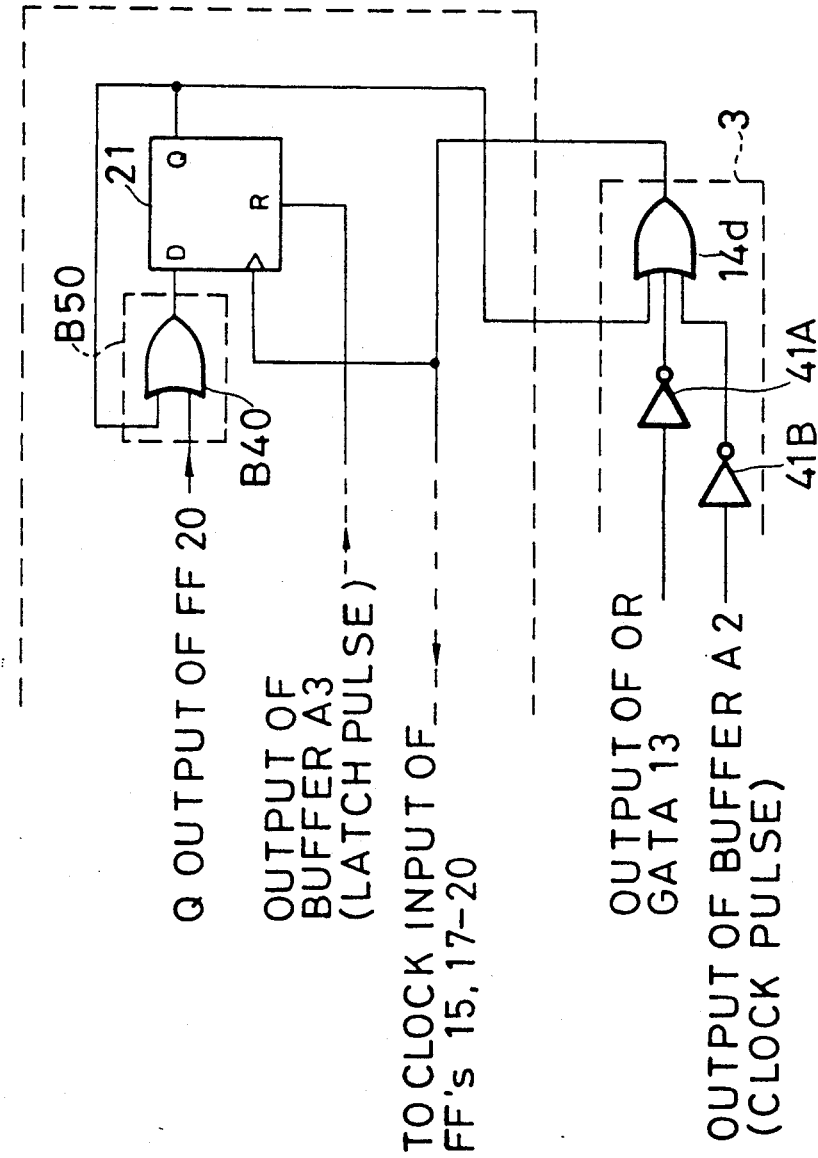

FIG. 14 shows an example in which the clock control circuit 3 is prohibited when the first clock control signal is High ant the AND gate 14 forming the clock control circuit 3 is replaced by an OR gate 14d. FIG. 14 shows only part of the shift register 5, the gate circuit B50 and part of the clock control circuit 3. Connected to the first input terminal of the OR gate 14d is the Q output of the FF 21, connected to the second input terminal is the output of the OR gate 13 via in inverter 41A, and input to the third input terminal is an inverted clock pulse CP via another inverter 41B. The rest of the connections are identical to those in FIG. 8. In this example, when the Q output of the FF 21 goes High, and this High signal is input to the first input terminal of the OR gate 14d, the output of the OR gate 14d is fixed to the High level, and the output of the shift pulse is prohibited. The operation is otherwise identical to that of the embodiment of FIG. 8.

Similar embodiments can be conceived, but their description is omitted. Description has been made on the case where the serial data are in one bit. The invention is applicable to cases for 2 bits, 4 bits, and so on. The signal input from outside and blocked responsive to the end signal is the the clock pulse, but the signal may be used for blocking the input of the drive data input serially, or for blocking the input of the clock pulse and the drive data.

As has been described in detail, according to the embodiments of FIG. 7 to FIG. 14, even if the frequency of the clock pulses CP for the data transfer is increased and its period is shortened, with the increase in the size of the screen of the LCD or the like, in each of the cascaded drive units for reading the data, it is ensured that the input of the clock to the shift register is prohibited after the reading of the data and before the reading of the data which the drive unit is to output next, and it is therefore possible to substantially reduce the power consumption of the overall system. As shown in Table 2, the effect is appreciated from the consumption current for the case in which 16 drive units formed of C-MOS of 4 μm are cascaded.

TABLE 2

| CONSUMPTION CURRENT WITH 16 CASCADED DRIVE UNITS | | | |
|---|---|---|---|
| Clock Pulse Frequency | 3 MHz | 6 MHz | 12 MHz |
| Prior Art | 35 mA | 160 mA | 320 mA |
| Invention | 35 mA | 70 mA | 140 mA |
| Invention/Prior Art | 100% | 44% | 44% |

What is claimed is:

1. A drive system having a plurality of driver circuits, each of the driver circuits comprising:
   a data input terminal at which the drive data is serially input;
   a data latch circuit formed of a plurality of latch circuits which successively latch the drive data and output said drive data in parallel;
   a counter circuit which provides, responsive to clock pulses, latch signals for bringing the latch circuits into a state in which they are capable of latching in succession, and which outputs an end signal when the output of the latch signals is completed; and
   a gate circuit inserted between the data input terminal and the data latch circuit, said gate circuit being responsive to the end signal to block output of the drive data therefrom.

2. The drive system of claim 1, further comprising a clock pulse input terminal at which the clock pulses are input, and a second gate circuit inserted between the clock pulse input terminal and the counter circuit, said second gate circuit being responsive to the end signal to block output of the clock pulses therefrom.

3. The drive system of claim 2, further comprising:
   an enable signal input terminal provided for input of an enable signal, said second gate circuit outputting the clock pulses in response to the enable signal;
   an enable signal output terminal provided for outputting the enable signal; and
   an enable signal output circuit responsive to a predetermined one of the latch signals output from the counter circuit to output the enable signal to the enable signal output terminal.

4. A drive system comprising first and second cascaded drive units, each of the drive units comprising:
   a data input terminal at which drive data is serially input;
   a data latch circuit formed of a plurality of latch circuits which successively latch the drive data and output said drive data in parallel;
   a counter circuit which provides, responsive to clock pulses, latch signals for bringing the latch circuits into a state in which they are capable of latching, responsive to the clock pulses, each of said drive units being provided with an enable signal input terminal for input of an input enable signal;
   a judgement circuit responsive to the input enable signal to output an operation signal; and
   a gate circuit inserted between the data input terminal and the data latch circuit, said gate circuit being responsive to the operation signal output from the judgement circuit to block output of the drive data therefrom.

5. The drive system of claim 4, wherein the first drive unit further comprises:
- an enable signal output terminal provided for outputting an output enable signal to the enable signal input terminal of the second drive unit; and
- an enable signal output circuit responsive to a predetermined one of latch signals output from the counter circuit to output the output enable signal to the enable signal output terminal.

6. A drive device comprising:
- a data input terminal at which drive data is serially input;
- a data latch circuit formed of a plurality of latch circuits which successively latch the drive data and output said drive data in parallel;
- a counter circuit having a plurality of first flip-flops which provide, responsive to clock pulses, latch signal for bringing the latch circuits into a state in which they are capable of latching in succession;
- a second flip-flop which produces an output signal after the output of the latch signals to said plurality of latch circuits is completed and an end signal; and
- a gate circuit receiving (a) a latch complete signal of a predetermined level that is output from a predetermined one of the first flip-flops when the output of the latch signals to said plurality of latch circuits is completed, and (b) the output signal from said second flip-flop, said gate circuit performing a logical operation on said latch complete and output signals, said gate circuit supplying a signal of said predetermined level for a predetermined period based on the latch complete signal and the output signal of said second flip-flop; and a blocking circuit responsive to the end signal to prohibit input of a predetermined input signal from outside of the drive device.

7. The drive device of claim 6, wherein said predetermined input signal from outside the drive device comprises said clock pulses, and said blocking circuit blocks input of said clock pulses to the counter circuit.

8. The drive device of claim 6, wherein said predetermined input signal from outside the drive device comprises said drive data, and said blocking circuit blocks input of said drive data to the data latch circuit.

9. The drive device of claim 8, wherein said predetermined input signal input from outside the drive device comprises said clock pulse and said drive data, and said blocking circuit blocks input of said clock pulses to the counter circuit, and input of said drive data to said data latch circuit.

* * * * *